(12) United States Patent
Lee et al.

(10) Patent No.: US 8,368,182 B2
(45) Date of Patent: Feb. 5, 2013

(54) SEMICONDUCTOR DEVICES INCLUDING PATTERNS

(75) Inventors: Young-ho Lee, Seoul (KR); Jae-hwang Sim, Seoul (KR); Young-seop Rah, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 489 days.

(21) Appl. No.: 12/573,535

(22) Filed: Oct. 5, 2009

(65) Prior Publication Data
US 2010/0155906 A1 Jun. 24, 2010

(30) Foreign Application Priority Data

Dec. 24, 2008 (KR) .................. 10-2008-0133838

(51) Int. Cl.
*H01L 29/06* (2006.01)
(52) U.S. Cl. .................. 257/623; 257/E29.022
(58) Field of Classification Search .................. 257/623
See application file for complete search history.

(56) References Cited

U.S. PATENT DOCUMENTS

| 5,468,578 A * | 11/1995 | Rolfson .................. 430/5 |
| 7,084,440 B2 * | 8/2006 | Sel et al. .................. 257/208 |
| 2002/0022311 A1 * | 2/2002 | Takeuchi et al. .................. 438/200 |
| 2003/0042223 A1 * | 3/2003 | Toyosaki et al. .................. 216/2 |
| 2003/0062550 A1 * | 4/2003 | Sekiguchi et al. .................. 257/208 |
| 2003/0227063 A1 * | 12/2003 | Sel et al. .................. 257/390 |
| 2007/0210449 A1 | 9/2007 | Caspary et al. |
| 2008/0206686 A1 * | 8/2008 | Lee et al. .................. 430/323 |
| 2008/0296737 A1 * | 12/2008 | Weis et al. .................. 257/623 |
| 2009/0288867 A1 * | 11/2009 | Tu et al. .................. 174/261 |
| 2010/0012981 A1 * | 1/2010 | Becker et al. .................. 257/208 |
| 2010/0090349 A1 * | 4/2010 | Park et al. .................. 257/773 |
| 2010/0167214 A1 * | 7/2010 | Yoon et al. .................. 430/323 |
| 2010/0193960 A1 * | 8/2010 | Mashita et al. .................. 257/773 |
| 2011/0068439 A1 * | 3/2011 | Tsai et al. .................. 257/653 |
| 2011/0266647 A1 * | 11/2011 | Parekh et al. .................. 257/506 |

FOREIGN PATENT DOCUMENTS

| JP | 2008-027978 | 2/2008 |
| KR | 1020060135126 A | 12/2006 |

* cited by examiner

*Primary Examiner* — A. Sefer
(74) *Attorney, Agent, or Firm* — Myers Bigel Sibley & Sajovec, P.A.

(57) ABSTRACT

Provided are a method of forming patterns for a semiconductor device in which a pattern density is doubled by performing double patterning in a part of a device region while patterns having different widths are being simultaneously formed, and a semiconductor device having a structure to which the method is easily applicable. The semiconductor device includes a plurality of line patterns extending parallel to each other in a first direction. A plurality of first line patterns are alternately selected in a second direction from among the plurality of line patterns and each have a first end existing near the first side. A plurality of second line patterns are alternately selected in the second direction from among the plurality of line patterns and each having a second end existing near the first side. The first line patterns alternate with the second line patterns and the first end of each first line pattern is farther from the first side than the second end of each second line pattern.

19 Claims, 34 Drawing Sheets

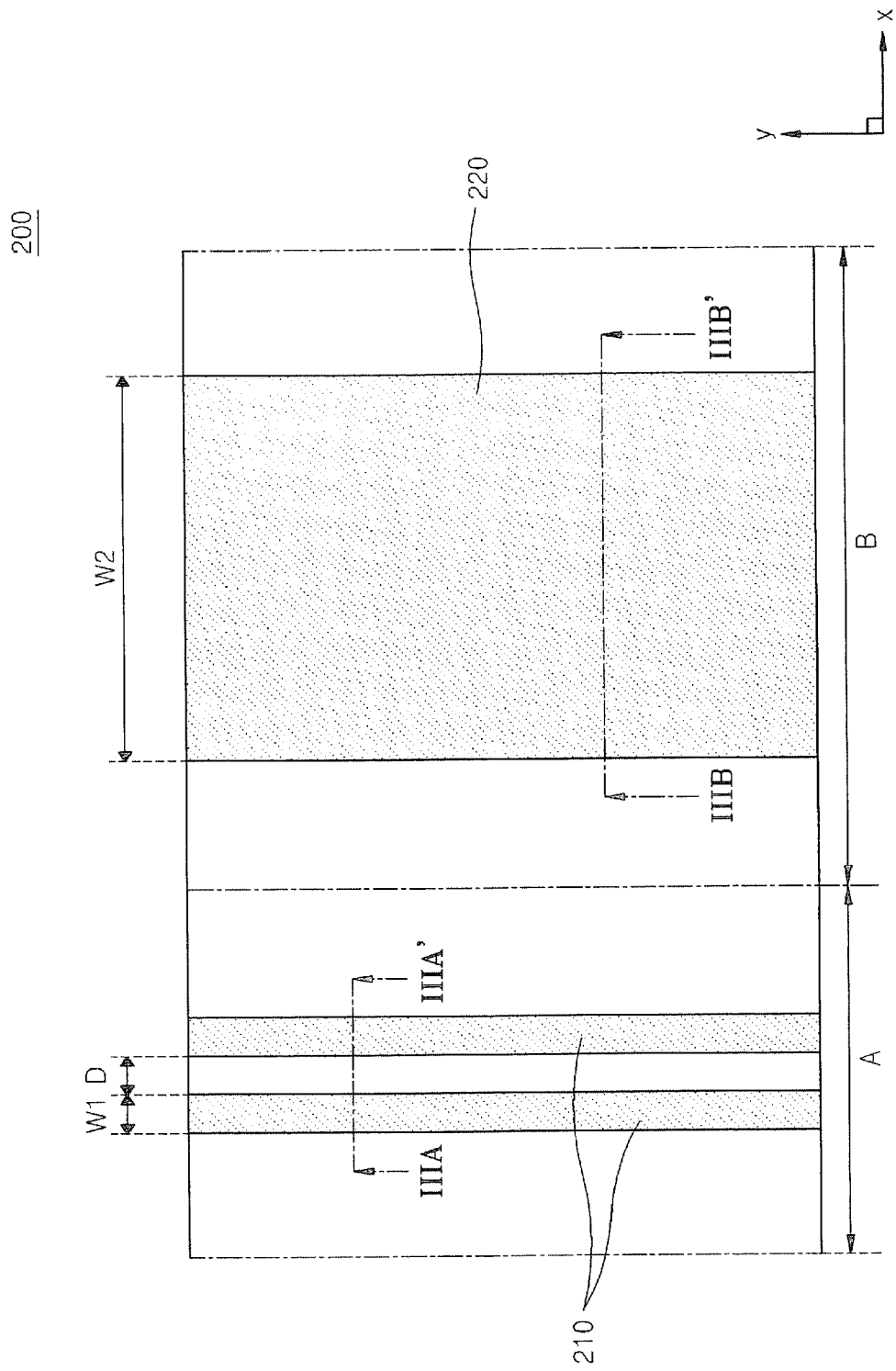

D1 > D2

FIG. 7A
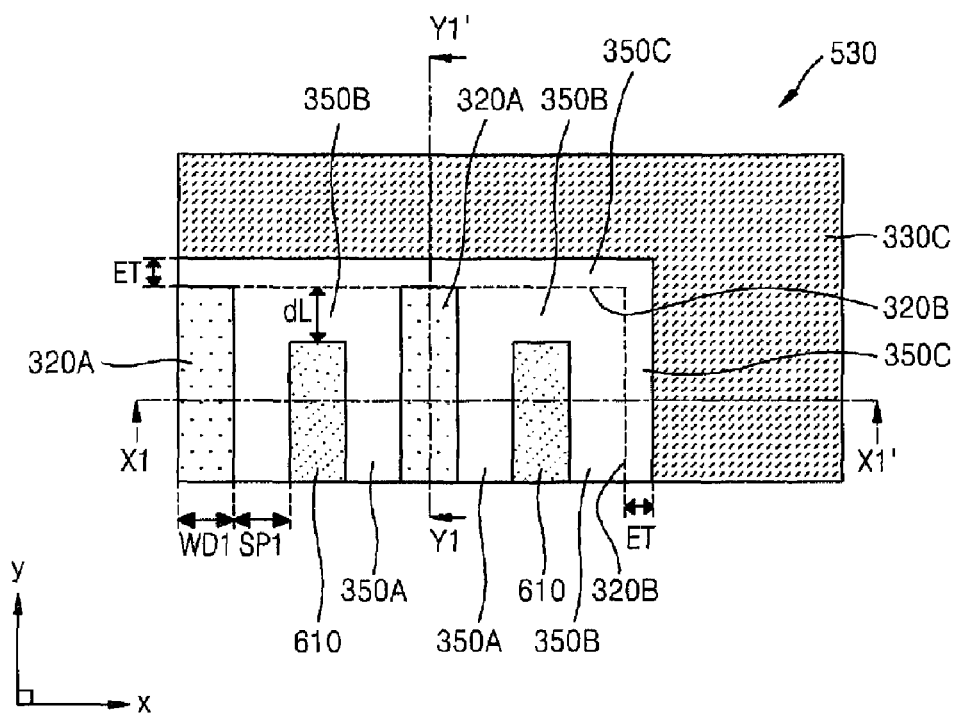
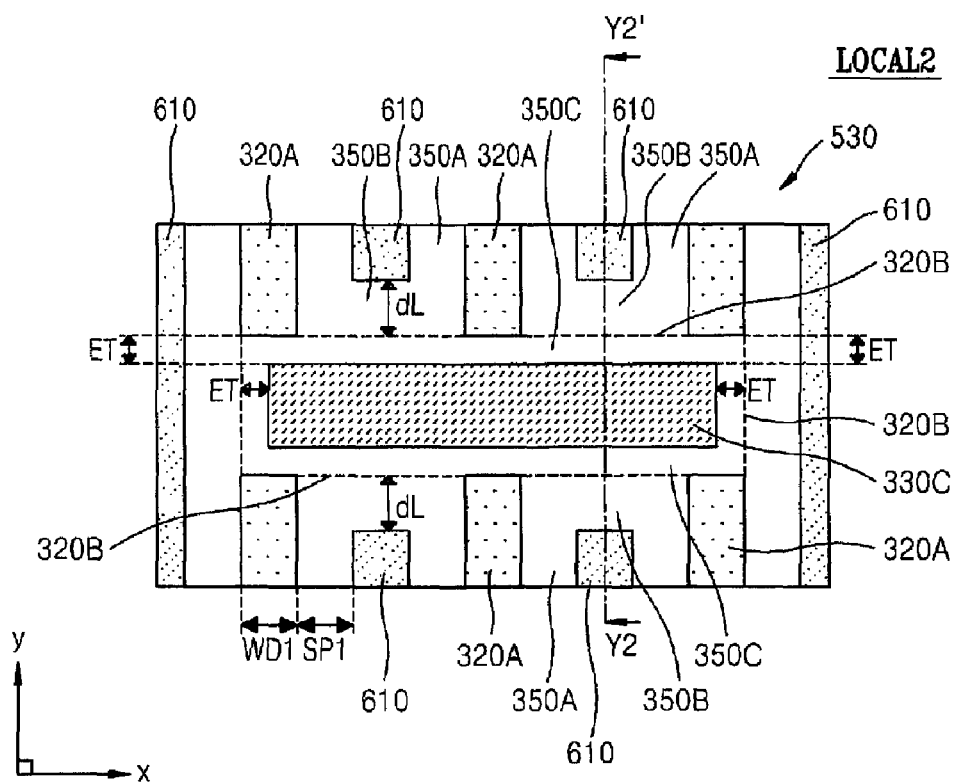

FIG. 8A
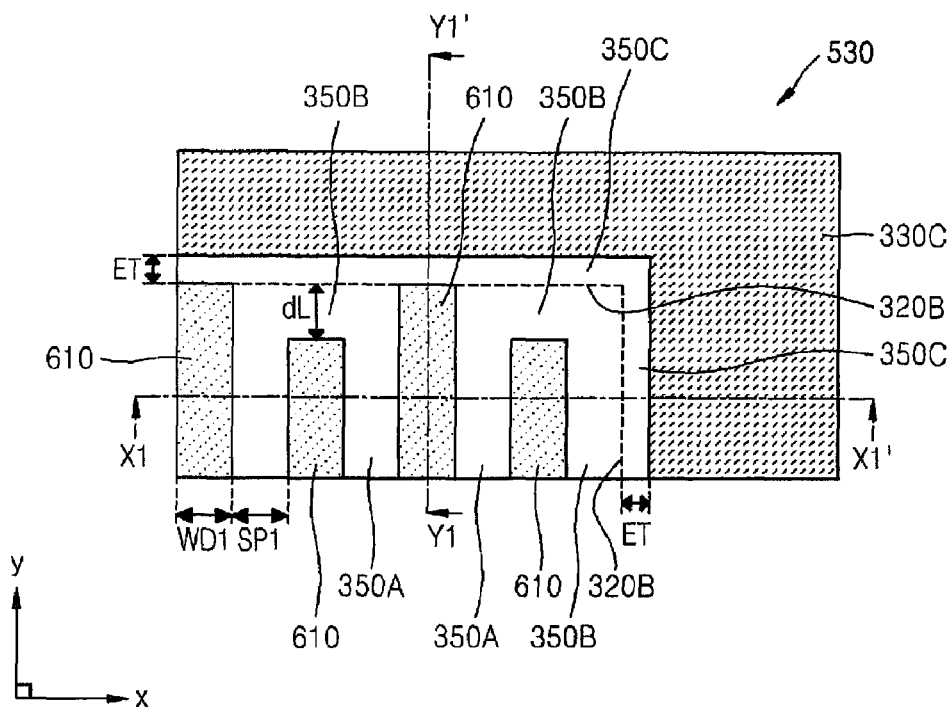
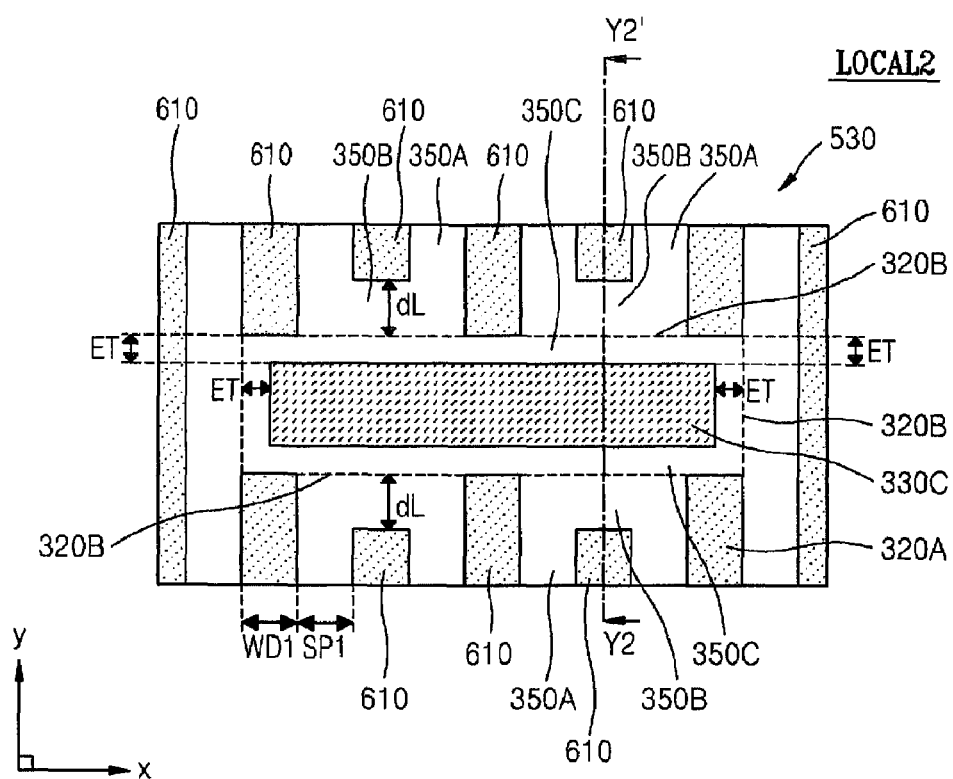

FIG. 9A
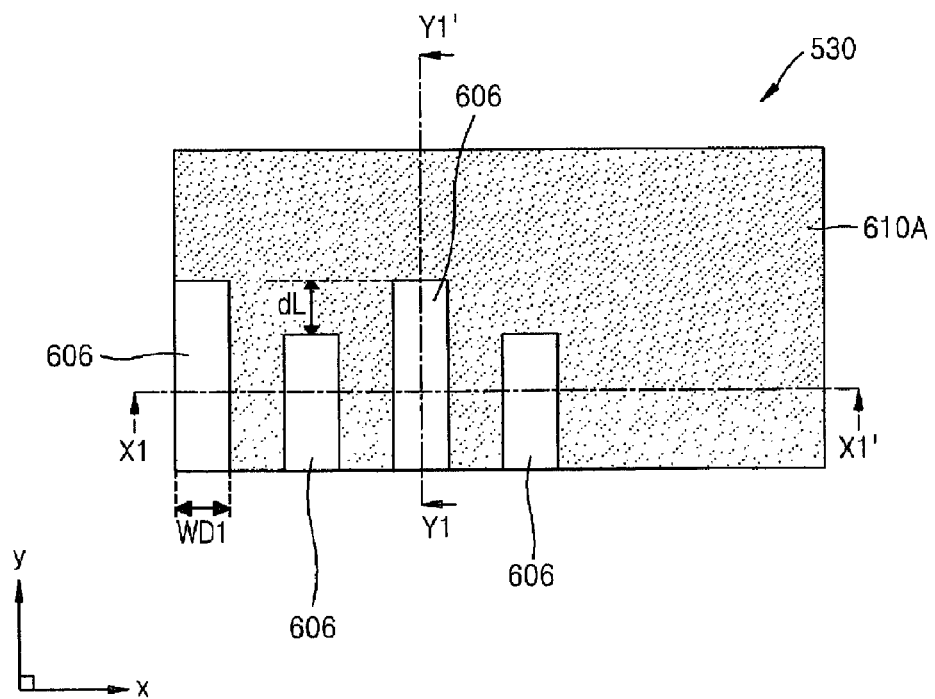
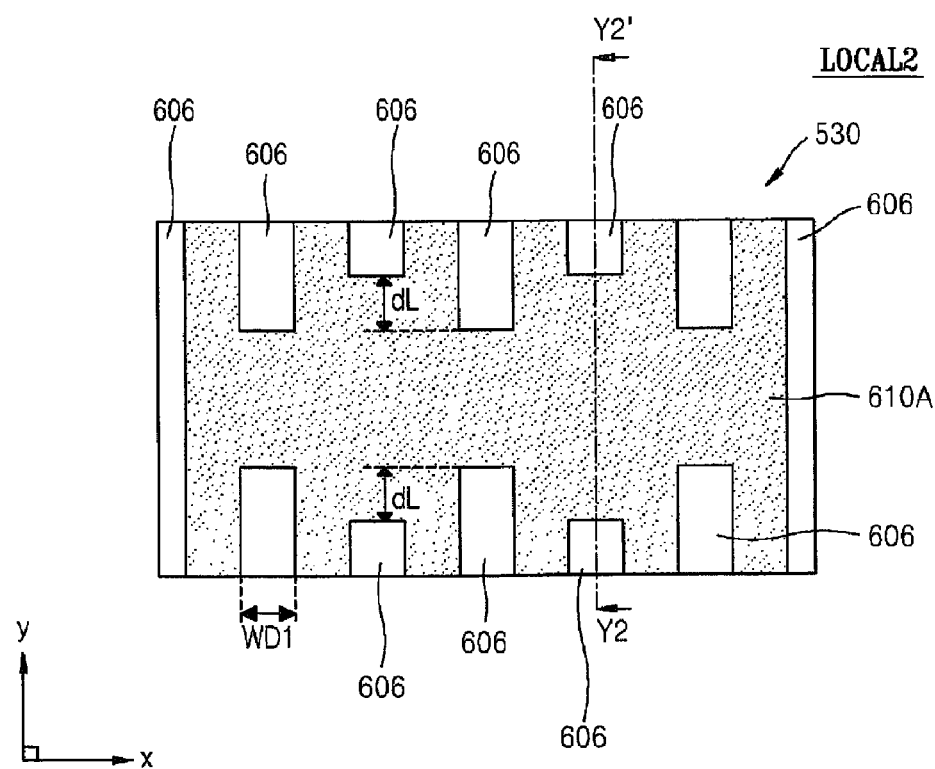

FIG. 10A
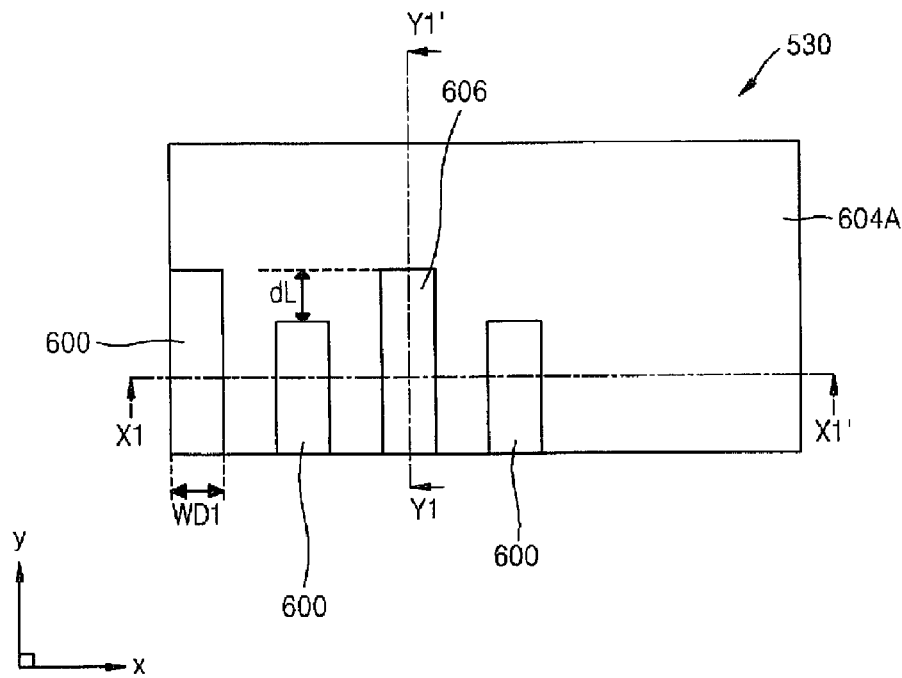
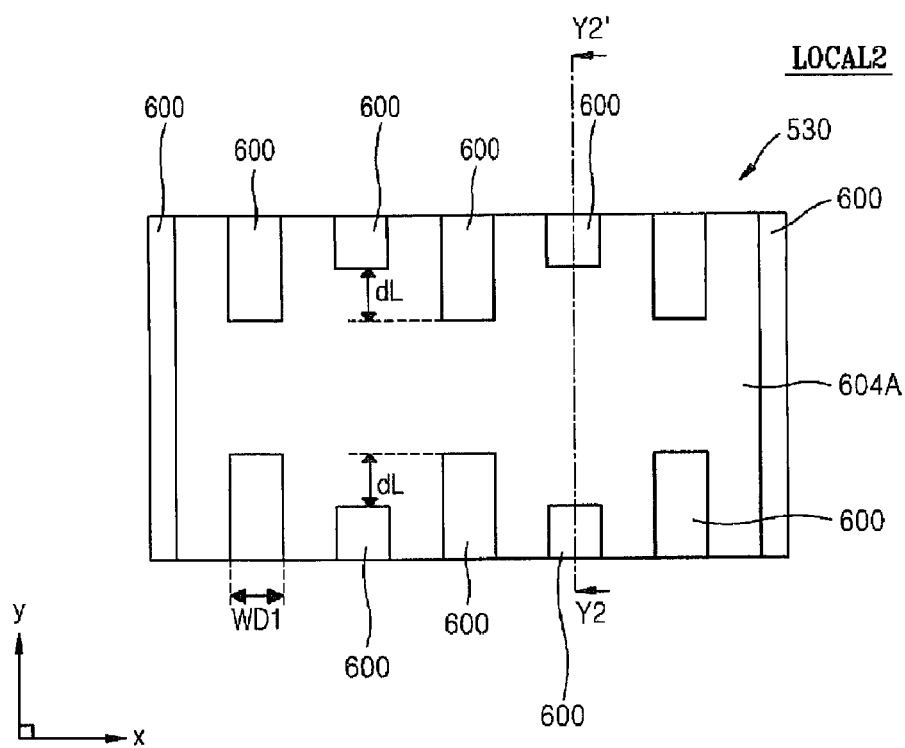

FIG. 11A
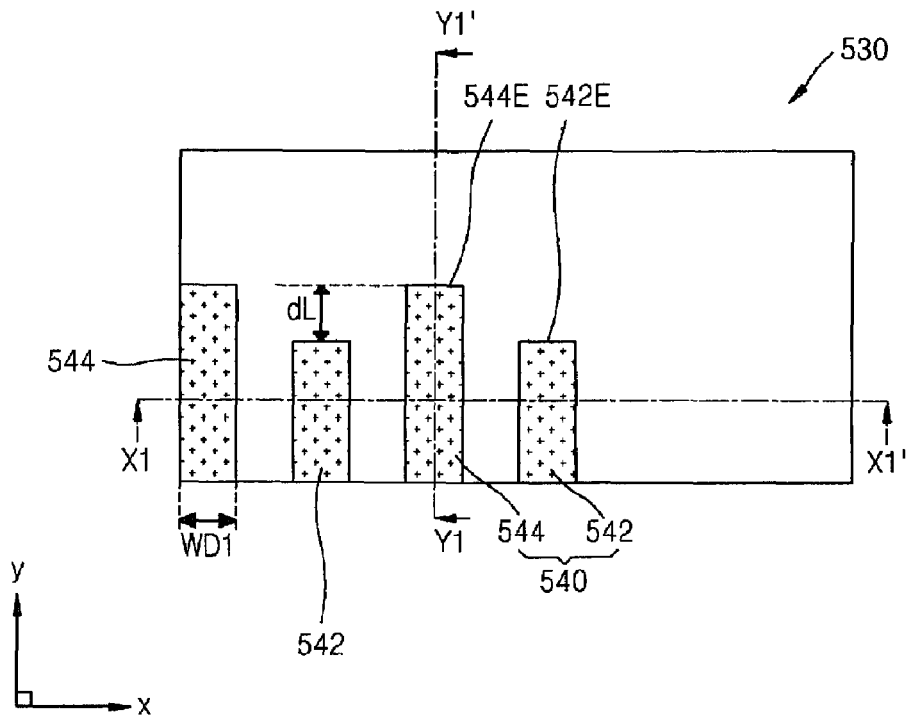
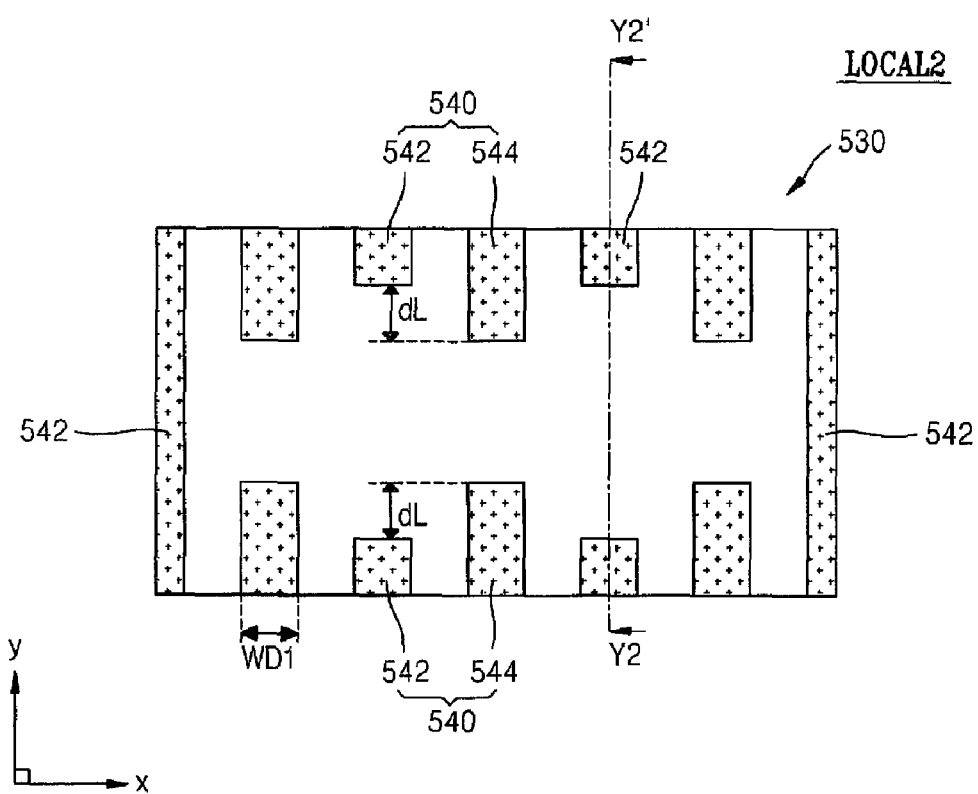

FIG. 12A
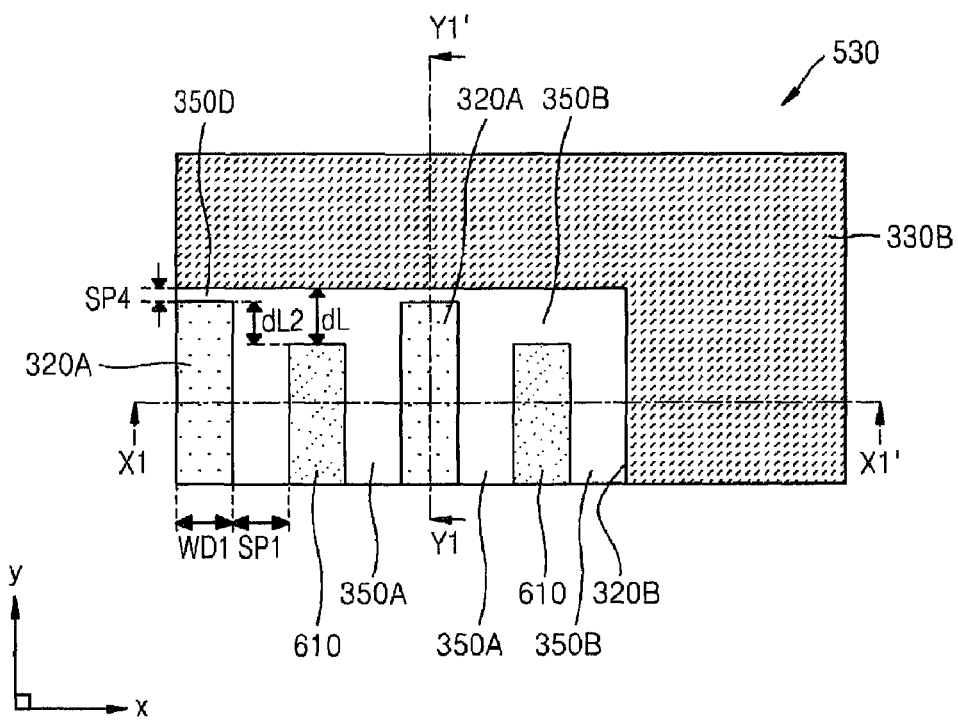
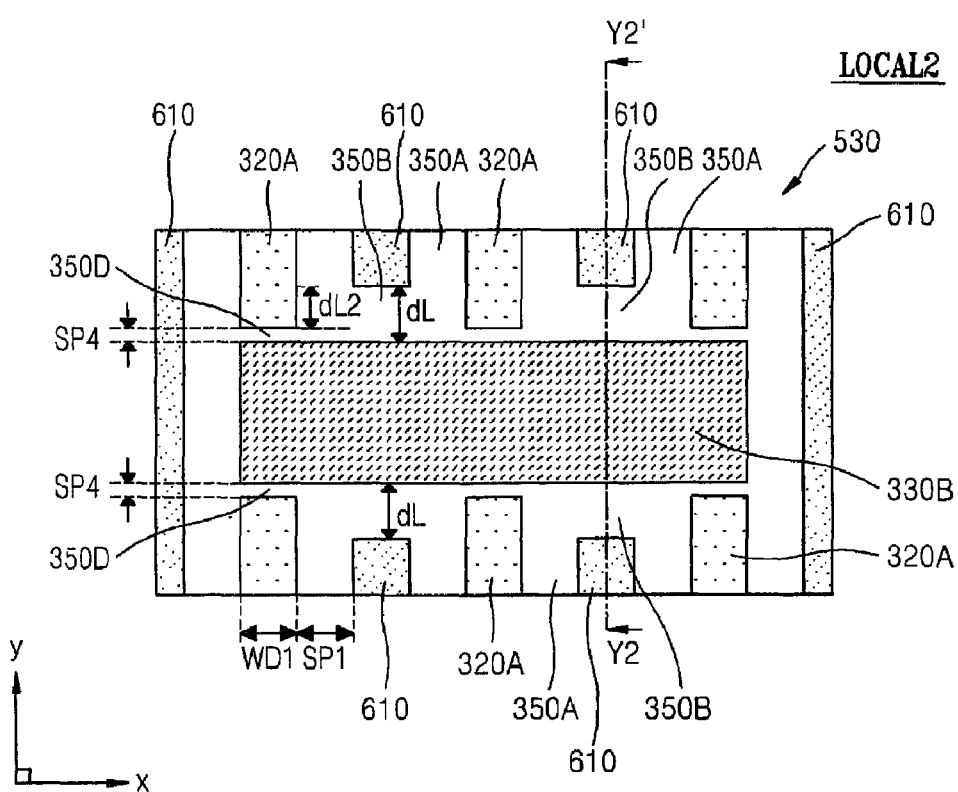

FIG. 13A
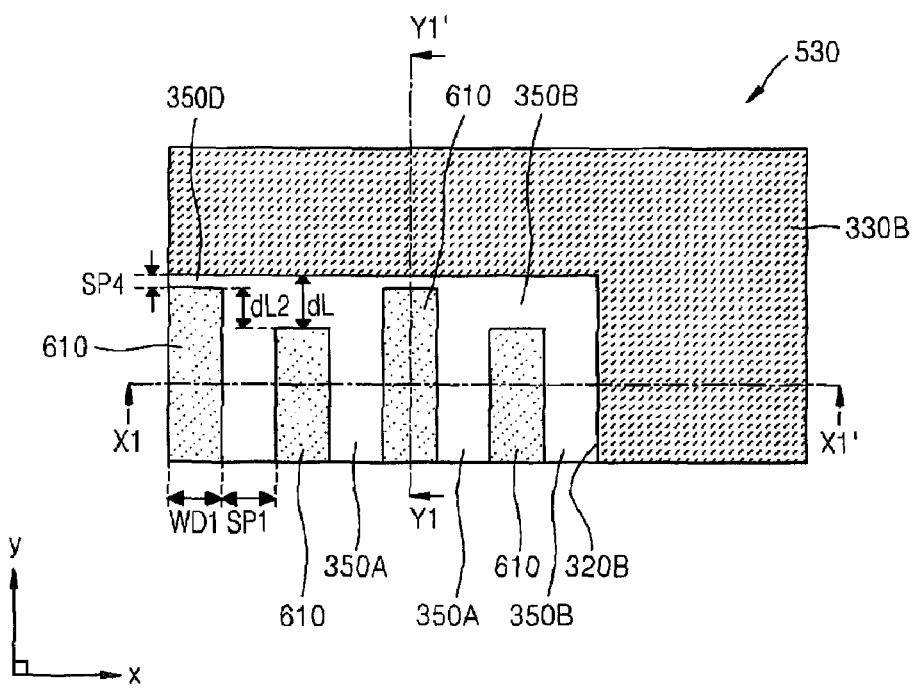
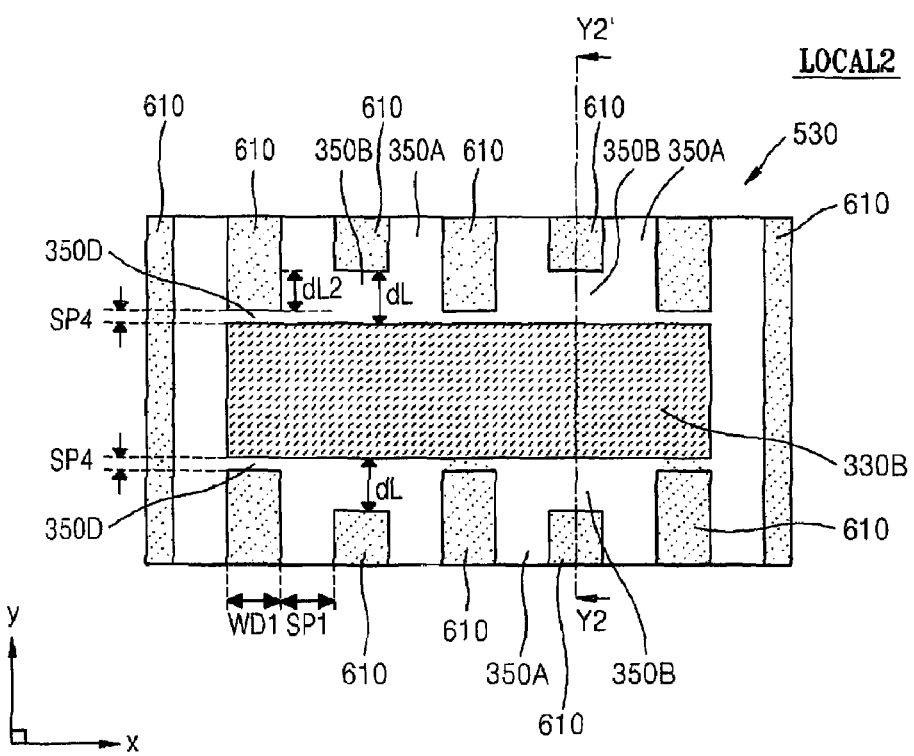

FIG. 14A
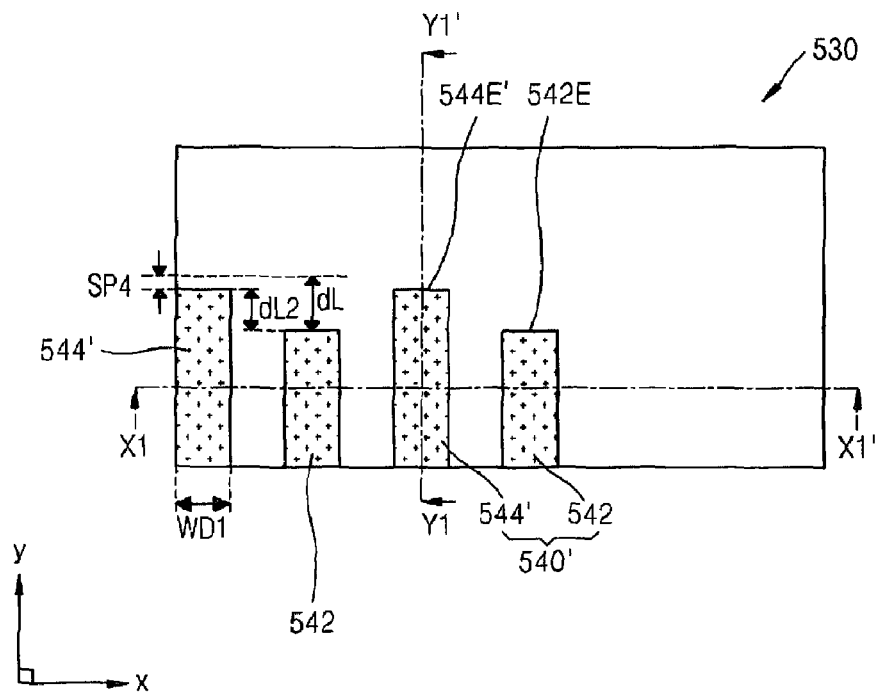
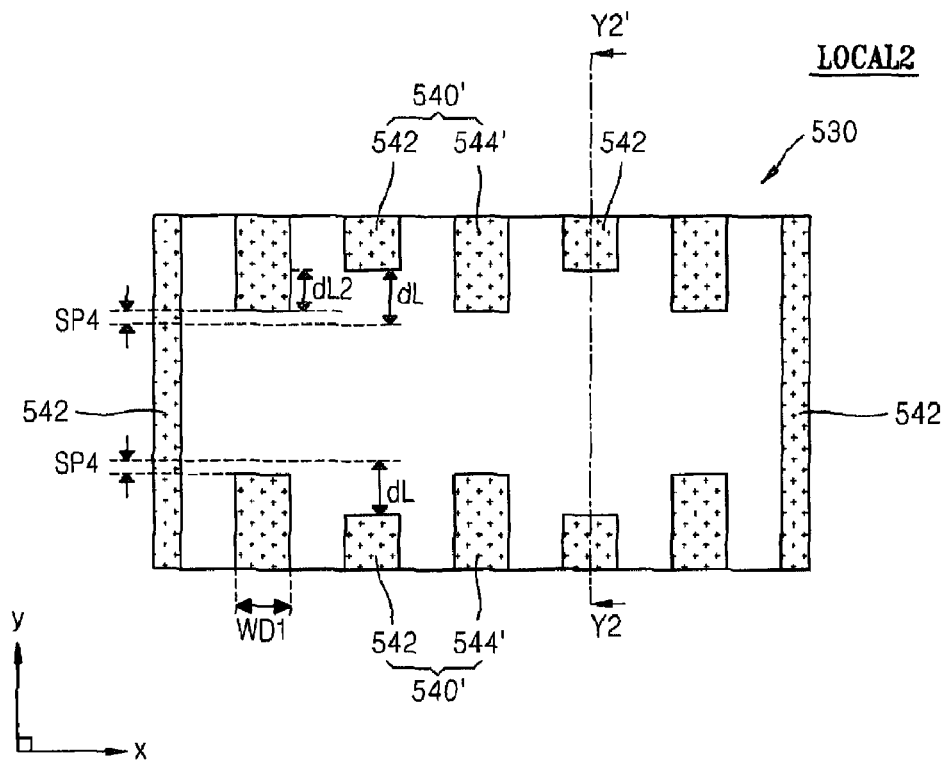

SEMICONDUCTOR DEVICES INCLUDING PATTERNS

CROSS-REFERENCE TO RELATED APPLICATIONS

This application claims priority to Korean Patent Application No. 10-2008-0133838, filed on Dec. 24, 2008, in the Korean Intellectual Property Office, the disclosure of which is incorporated herein in its entirety. This application is also related to U.S. patent application Ser. No. 12/428,963, filed: Apr. 23, 2009 and U.S. patent application Ser. No. 12/418,023, filed Apr. 3, 2009.

BACKGROUND

The inventive concept relates to a semiconductor device and a method of forming patterns for the semiconductor device, and more particularly, to a semiconductor device having a structure obtained using a high-density pattern formation narrow-width line pattern for forming patterns having various widths and a wide-width pattern connected to the high-density pattern formation narrow-width line pattern, simultaneously, and a method of forming patterns for the semiconductor device, in which various patterns necessary for the semiconductor device are formed using the narrow-width line pattern and the wide-width pattern.

In the manufacture of highly-integrated semiconductor devices, a technique of forming various patterns simultaneously while reducing the number of times a photolithographic process can be used to form fine patterns for a semiconductor device by using both fine patterns repeatedly formed at fine pitches and patterns having relatively large widths.

SUMMARY

According to an aspect of the inventive concept, there is provided a semiconductor device including a plurality of line patterns extending parallel to each other in a first direction while being apart from each other in a center portion of a device region on a substrate, wherein the center portion is apart from a first side of the device region. The plurality of line patterns includes a plurality of first line patterns alternately selected in a second direction perpendicular to the first direction from among the plurality of line patterns and each having a first end existing near the first side; and a plurality of second line patterns alternately selected in the second direction from among the plurality of line patterns and each having a second end existing near the first side, wherein the first line patterns alternate with the second line patterns and the first end of each first line pattern is farther from the first side than the second end of each second line pattern.

In the semiconductor device, the first and second line patterns may alternate with each other one by one.

Each of the first ends of the first line patterns may be a first distance away from the first side of the device region. Each of the second ends of the second line patterns may be a second distance away from the first side of the device region, wherein the second distance is shorter than the first distance.

The plurality of line patterns may further include an outermost line pattern located on the outermost side of the plurality of line patterns. The outermost line pattern may have an end existing near the first side, wherein the end of the outermost line pattern is farther from the first side than an end existing near the first side from among two ends of a line pattern neighboring the outermost line pattern.

The device region may include a second side facing the first side with the center portion interposed between the first and second sides. The plurality of first line patterns may have third ends corresponding to ends opposite to the first ends, wherein the third ends are farther from the second side than ends close to the second side from among respective both ends of every two second line patterns adjacent to both sides of each of the first line patterns. The plurality of second line patterns may have fourth ends corresponding to ends opposite to the second ends, wherein the fourth ends are closer to the second side than ends close to the second side from among respective both ends of every two first line patterns adjacent to both sides of each of the second line patterns.

The semiconductor device may further include a plurality third line patterns a first distance apart from some first line patterns, respectively, selected from the plurality of first line patterns so as to be adjacent to the selected first line patterns, respectively, in the first direction in the center portion of the device region; and a plurality fourth line patterns a second distance apart from some second line patterns, respectively, selected from the plurality of second line patterns so as to be adjacent to the selected second line patterns, respectively, in the first direction in the center portion of the device region. The first distance may be greater than the second distance. The first distance and the second distance may be greater than a width of each of the plurality of line patterns with respect to the second direction.

The center portion of the device region may include non-pattern regions that extend along the first direction by lengths greater than the width in the second direction of each of the plurality of line patterns and in which the line patterns are not formed. Widths in the first direction of the non-pattern regions may be defined by each of the selected first line patterns and a corresponding one of the third line patterns and by each of the selected second line patterns and a corresponding one of the fourth line patterns, and widths in the second direction of the non-pattern regions may be defined by every two line patterns selected from the plurality of line patterns. At least one line pattern selected from the third and fourth line patterns may exist between the every two line patterns selected from the plurality of line patterns.

In the semiconductor device, the first line patterns and the second line patterns may be arranged at regular intervals along the second direction.

The plurality of line patterns may be isolation films for defining an active region in the device region. A plurality of line-type active regions each located between every two of the plurality line patterns may be defined by the plurality of line patterns in the center portion of the device region. The semiconductor device may further include a plurality of third line patterns a first distance apart from some first line patterns, respectively, selected from the plurality of first line patterns so as to be adjacent to the selected first line patterns, respectively, in the first direction in the center portion of the device region; and a plurality of fourth line patterns a second distance apart from some second line patterns, respectively, selected from the plurality of second line patterns so as to be adjacent to the selected second line patterns, respectively, in the first direction in the center portion of the device region, wherein island-type active regions are defined by the first, second, third, and fourth line patterns in the center portion of the device region. The island-type active regions may include portions having different widths in the first direction.

According to another aspect of the inventive concept, there is provided a method of forming patterns for a semiconductor device, the method including forming a first layer on a substrate that comprises a device region that has a center portion and an edge portion that surrounds the center portion; forming a dual mask layer on the first layer; forming a mask pattern by patterning the dual mask layer, wherein the mask pattern comprises a plurality of first mask patterns that extend parallel to each other in a first direction in the center portion, are a first interval apart from each other in a second direction perpendicular to the first direction, each have a first width in the second direction, and have first mask ends, respectively, facing the edge portion, and a second mask pattern that exists on the edge portion, has a second width greater than the first width in the first direction; forming a spacer, the spacer comprising a plurality of first spacers covering both sidewalls of the plurality of first mask patterns and a plurality of second spacers covering sidewalls of the second mask pattern; removing the first mask patterns; and etching the first layer in the device region by using the second mask pattern, the plurality of first spacers, and the plurality of second spacers as etch masks.

In the method, a plurality of line patterns extending parallel to each other in the first direction and apart from each other by a second interval smaller than the first interval in the second direction in the center portion may be transcribed to the first layer by the etching of the first layer. The plurality of line patterns may include a plurality of first line patterns alternately selected in the second direction from among the plurality of line patterns and each having first ends farther from the edge portion than respective both ends of two line patterns existing on both sides of each first line pattern; and a plurality of second line patterns alternately selected in the second direction from among the plurality of line patterns and each having second ends closer to the edge portion than respective ends of two line patterns existing on both sides of each second line pattern.

A semiconductor device comprising a plurality of line patterns extending parallel to each other in a first direction while being apart from each other in a center portion of a device region on a substrate, wherein the center portion is apart from a first side of the device region outside the center portion, wherein the plurality of line patterns includes an alternatingly arranged plurality of line patterns wherein immediately adjacent ones of the alternatingly arranged plurality of line patterns include end portions thereof that are staggered relative to the first side to be separated from the first edge by alternating distances.

BRIEF DESCRIPTION OF THE DRAWINGS

Exemplary embodiments of the inventive concept will be more clearly understood from the following detailed description taken in conjunction with the accompanying drawings in which:

FIG. 2 is a layout of a portion of a semiconductor device for explaining processes that can be used in performing the pattern forming method according to the present invention;

FIG. 6A through to FIG. 11C are views illustrating a method of manufacturing the semiconductor device of FIG. 5A according to the first process illustrated in FIGS. 3A through 3H, wherein FIGS. 6A, 7A, 8A, 9A, 10A, and 11A are plan views illustrating some region of the semiconductor device of FIG. 5A, FIGS. 6B, 7B, 8B, 9B, 10B, and 11B are cross-sections taken along a plane X1-X1' of FIGS. 6A, 7A, 8A, 9A, 10A, and 11A, FIGS. 6C, 7C, 8C, 9C, 10C, and 11C are cross-sections taken along planes Y1-Y1' and Y2-Y2' of FIGS. 6A, 7A, 8A, 9A, LOA, and 11A;

FIG. 12A through to FIG. 14C are views illustrating a method of manufacturing the semiconductor device of FIG. 5A according to the second process illustrated in FIGS. 4A through 4D, wherein FIGS. 12A, 13A, and 14A are plan views of regions indicated as "LOCAL 1" and "LOCAL 2" of FIG. 6A from the part of the semiconductor device illustrated in FIG. 5A, FIGS. 12B, 13B, and 14B are cross-sections taken along a plane X1-X1' of FIGS. 12A, 13A, and 14A, and FIGS. 12C, 13C, and 14C are cross-sections taken along planes Y1-Y1' and Y2-Y2' of FIGS. 12A, 13A, and 14A;

DETAILED DESCRIPTION OF THE EMBODIMENTS

Figure 1:
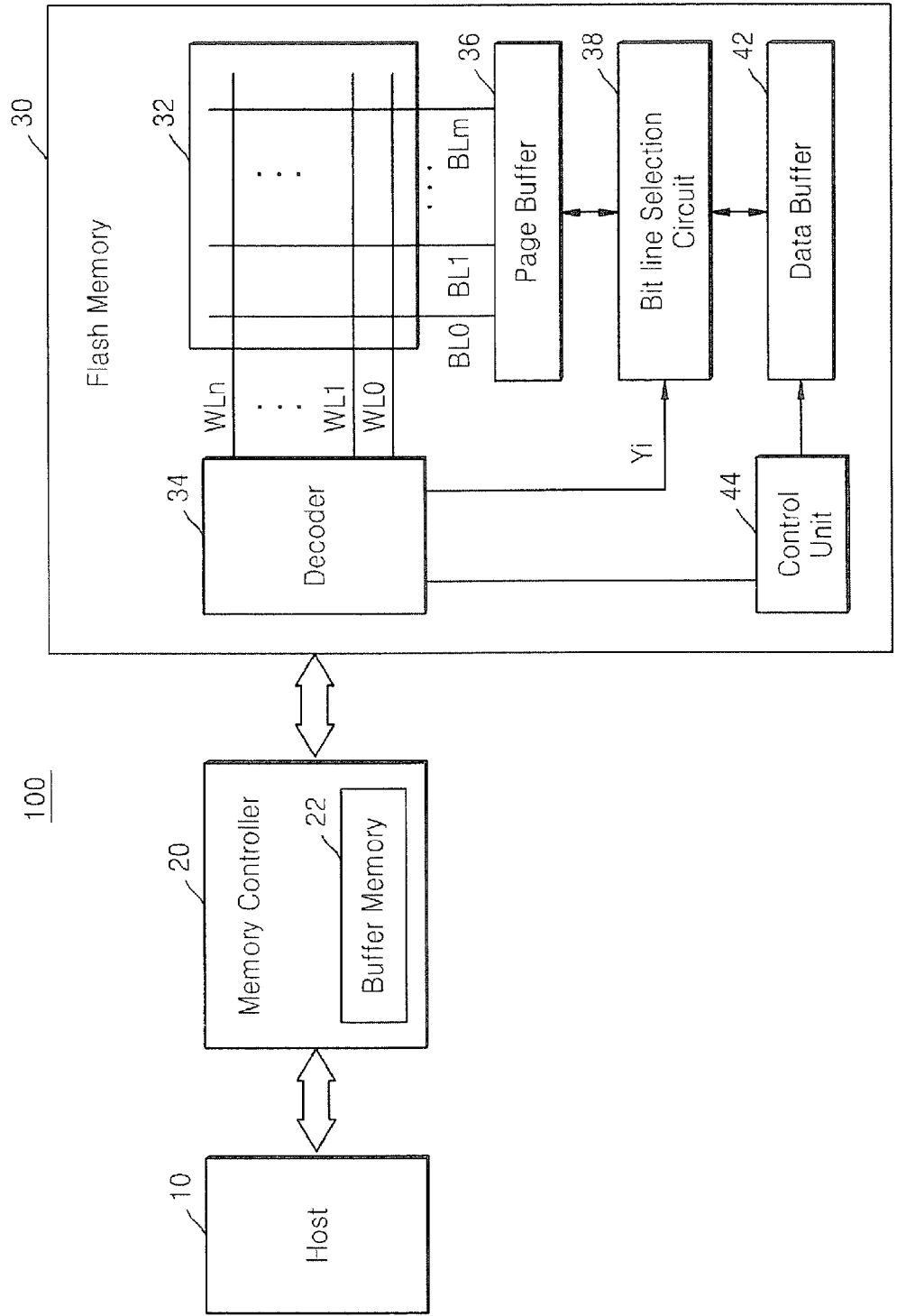
FIG. 1 is a block diagram schematically illustrating a memory system of a semiconductor device that can be manufactured using a pattern forming method according to the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses and widths of layers and regions are exaggerated for clarity. Like reference numerals in the drawings denote like elements. The elements and regions illustrated in the figures are schematic in nature, and thus relative sizes or intervals illustrated in the figures are not intended to limit the scope of the invention.

FIG. 1 is a block diagram schematically illustrating a memory system 100 of a semiconductor device that can be manufactured using a pattern forming method according to the present invention. Referring to FIG. 1, the memory system 100 includes a host 10, a memory controller 20, and a flash memory 30.

The memory controller 20 serves as an interface between the host 10 and the flash memory 30, and includes a buffer 22. Although not shown in FIG. 1, the memory controller 20 may further include a central processing unit (CPU), a read only memory (ROM), a random access memory (RAM), and interface blocks.

The flash memory 30 may include a cell array 32, a decoder 34, a page buffer 36, a bit line selection circuit 38, a data buffer 42, and a control unit 44.

The host 10 inputs data and a write command to the memory controller 20. The memory controller 20 controls the flash memory 30 such that the received data is written to the cell array 32 according to the received write command. The memory controller 20 also controls the flash memory 30 such that the data stored in the cell array 32 is read out according to a read command received from the host 10. The buffer memory 22 temporarily stores data transmitted between the host 10 and the flash memory 30.

The cell array 32 of the flash memory 30 includes a plurality of memory cells. The decoder 34 is connected to the cell array 32 via word lines WL0 through to WLn. The decoder 34 receives an address from the memory controller 20 and selects one of the word lines WL0 through to WLn or generates a selection signal Y1 for selecting bit lines BL0 through to BLm. The page buffer 36 is connected to the cell array 32 via the bit lines BL0 through to BLm.

FIG. 2 is a layout of a portion of a semiconductor device 200 for explaining processes that can be used in performing the pattern forming method according to the present invention.

Referring to FIG. 2, a first region A may be a central portion of a cell array region in which unit memories are formed. For example, the cell array 32 of FIG. 1 may be formed in the first region A. A second region B may be an edge portion of the cell array region. Alternatively, the second region B may be a peripheral circuit region or a core region in which peripheral circuits for operating the unit memories formed in the first region A are formed. Alternatively, the second region B may be a portion of the cell array region, in which patterns having large widths are formed.

In FIG. 2, the first region A includes a plurality of first patterns 210 among which every two adjacent first patterns 210 have first widths W1, which are relatively small, and are apart from each other a first distance D, which is relatively small. The first width W1 and the first distance D of the first region A may be designed, arbitrarily, according to the type and desired characteristics of unit memories to be formed therein. For example, the first width W1 and the first distance D may be the same as each other or different from each other.

The second region B includes a second pattern 220 having a second width W2, which is relatively large.

For example, the first patterns 210 may constitute an active region of the center portion of the cell array region or a conductive layer of the center portion of the cell array region. The second pattern 220 may constitute an active region of the edge portion of the cell array region or an active region of the peripheral circuit region. Alternatively, the second pattern 220 may constitute a conductive pattern of the peripheral circuit region or the cell array region. Alternatively, the second pattern 220 may constitute an align key. The first patterns 210 and the second pattern 220 may be formed separately from each other as illustrated in FIG. 2. However, although not shown in FIG. 2, the first and second patterns 210 and 220 may be connected to each other via a connecting unit (not shown) installed therebetween so as to form a single body.

FIGS. 3A through 3H are cross-sectional views illustrating a first process from among the processes that can be used in performing the pattern forming method according to the present invention. In FIGS. 3A through 3H, a portion corresponding to a cross-section taken along a plane IIIA-IIIA' of FIG. 2 is illustrated in the first region A, and a portion corresponding to a cross-section taken along a plane IIIB-IIIB' of FIG. 2 is illustrated in the second region B.

Figure 3A:
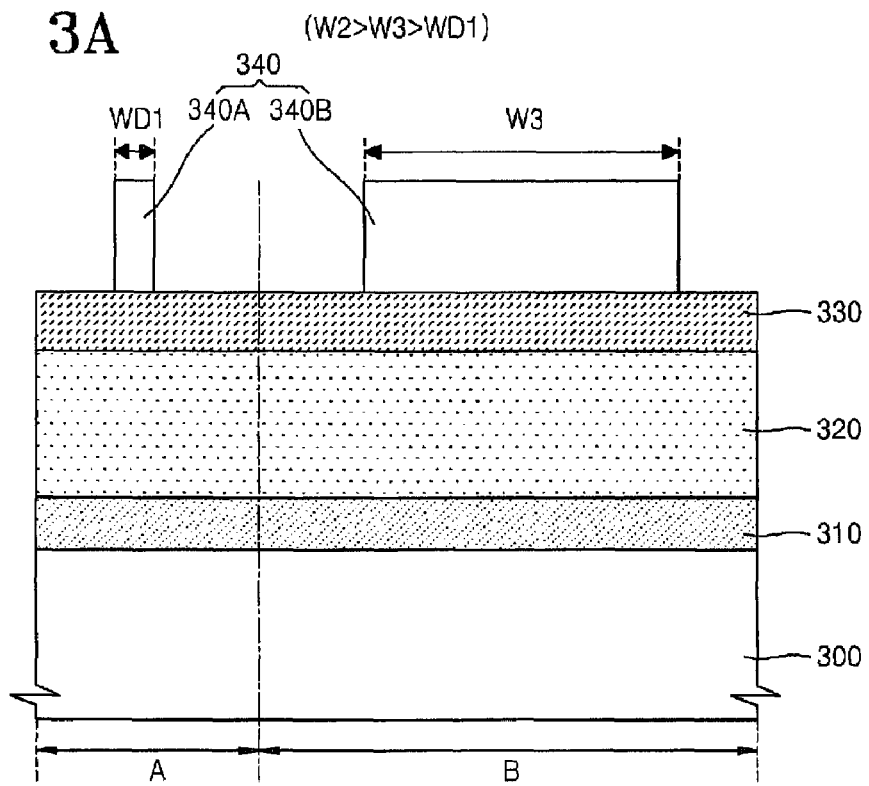
FIGS. 3A through 3H are cross-sectional views illustrating a first process from among the processes that can be used in performing the pattern forming method according to the present invention.

Referring to FIG. 3A, first, a tobe-etched film 310, a dual mask layer 320, and an etching mask layer 330 are sequentially formed in the first region A and the second region B on a substrate 300. Then, a mask pattern 340 is formed on the etching mask layer 330. The mask pattern 340 includes a first mask portion 340A having a fine width WD1 corresponding to the first difference D between every two adjacent first patterns 210 from among the plurality of first patterns 210 (see FIG. 2) which are desired to be formed in the first region A, and a second mask portion 340B having a third width W3 smaller than the second width W2 of the second pattern 220 which is desired to be formed in the second region B. The first and second mask portions 340A and 340B may be formed simultaneously by performing a photolithographic process using a single photomask once.

A difference between the third width W3 and the fine width WD1 is satisfied with a value that allows a result as described later with reference to FIG. 3D to be obtained. The larger the difference between the third width W3 and the fine width WD1 is, the more effective the result as described later with reference to FIG. 3D is.

The substrate 300 may be a typical semiconductor substrate, such as a silicon substrate.

The to-be-etched film 310 may be a conductive film or an insulation film. For example, the to-be-etched film 310 may be formed of a metal, a semiconductor material, or an insulation material. If the first pattern 210 and the second pattern 220 of FIG. 2 are active region patterns formed in the substrate 300, the to-be-etched film 310 may be not formed.

The dual mask layer 320 is used for different roles in the first region A than in the second region B. A portion of the dual mask layer 320, formed in the first region A, is used as a sacrificial film for forming a plurality of etch mask patterns having a doubled pattern density in the first region A. A portion of the dual mask layer 320, formed in the second region B, constitutes a part of an etch mask used to form a desired pattern in the second region B.

Various materials may be used to form the dual mask layer 320, according to the type of material the to-be-etched film 310 is formed of. For example, an amorphous carbon layer (ACL) or a carbon-contained layer may be used as the dual mask layer 320. Alternatively, the dual mask layer 320 may be formed of a material selected from silicon-contained materials such as $SiO_2$, $Si_3N_4$, SiCN, polysilicon, etc.

The dual mask layer 320 may be formed by spin coating or chemical vapor deposition (CVD). A process of forming the dual mask layer 320 by a carbon-contained layer will now be illustrated. First, an organic compound layer having a thickness of about 1000 Å-5000 Å is formed on the to-be-etched film 310. At this time, spin coating or deposition may be performed to form the organic compound layer. An organic compound used to form the organic compound layer may be a hydrogen carbide compound including an aromatic ring such as phenyl, benzene, or naphthalene. The organic compound may be composed of a material having a relatively high carbon content, namely, of about 85-99% by weight of carbon. The organic compound layer undergoes a first baking process at a temperature of about 150° C.-350° C., thereby forming the carbon-contained layer. The first baking process may be performed for about 60 seconds. Then, the carbon-contained layer undergoes a second baking process at a temperature of about 300° C.-550° C. so as to be hardened. The second baking process may be performed for about 30-300 seconds. This hardening of the carbon-contained layer according to the second baking process prevents the carbon-contained layer from being affected by a deposition process, in which a material is deposited at a relatively high temperature of about 400° C. or greater, in order to form another layer on the carbon-contained layer.

The etching mask layer 330 serves as an etch mask only in the second region B, wherein a relatively wide pattern is formed. The etching mask layer 330 may be formed to have the same thickness in both the first region A and the second region B. Alternatively, although not shown in FIG. 3A, the etching mask layer 330 may have a smaller thickness in the first region A than in the second region B. The thickness of the etching mask layer 330 may be set to a value such that a result of an isotropic etching process as described later with reference to FIG. 3D is obtained, in which the value is satisfied in consideration of a material used to form the etching mask layer 330, an etching condition for a subsequent process (see FIG. 3C) of etching the dual mask layer 320, the width WD1 of the first mask portion 340A, and the third width W3 of the second mask portion 340B. The determination of the thickness of the etching mask layer 330 will be described in greater detail later with reference to FIGS. 3C and 3D.

The etching mask layer 330 may be formed of a material having an etch selectivity different than that of the dual mask layer 320 so as to serve as an etch mask for the dual mask layer 320. For example, the etching mask layer 330 may be formed of one material selected from silicon-contained materials, such as SiON, $SiO_2$, $Si_3N_4$, SiCN, polysilicon, etc. Alternatively, the etching mask layer 330 may be formed of metal or an organic material. For example, the dual mask layer 320 may be formed of polysilicon and the etching mask layer 330 may be formed of $SiO_2$. Alternatively, the dual mask layer 320 may be a carbon-contained layer and the etching mask layer 330 may be formed of $SiO_2$. Alternatively, the dual mask layer 320 may be a carbon-contained layer and the etching mask layer 330 may be formed of SiON.

The mask pattern 340 may be formed using a photolithographic process. The mask pattern 340 may be a photoresist film. Alternatively, the mask pattern 340 may have a stacked structure including an anti-reflection film formed of an organic or inorganic material and the photoresist film.

The width WD1 of the first mask portion 340A of the mask pattern 340, which exists in the first region A, may correspond to a minimum feature size (1F) of a semiconductor device desired to be formed, and the third width W3 of the second mask portion 340B of the mask pattern 340, which exists in the second region B, may be larger than the minimum feature size. For example, the width WD1 of the first mask portion 340A may be several nm to several tens of nm.

Figure 3B:
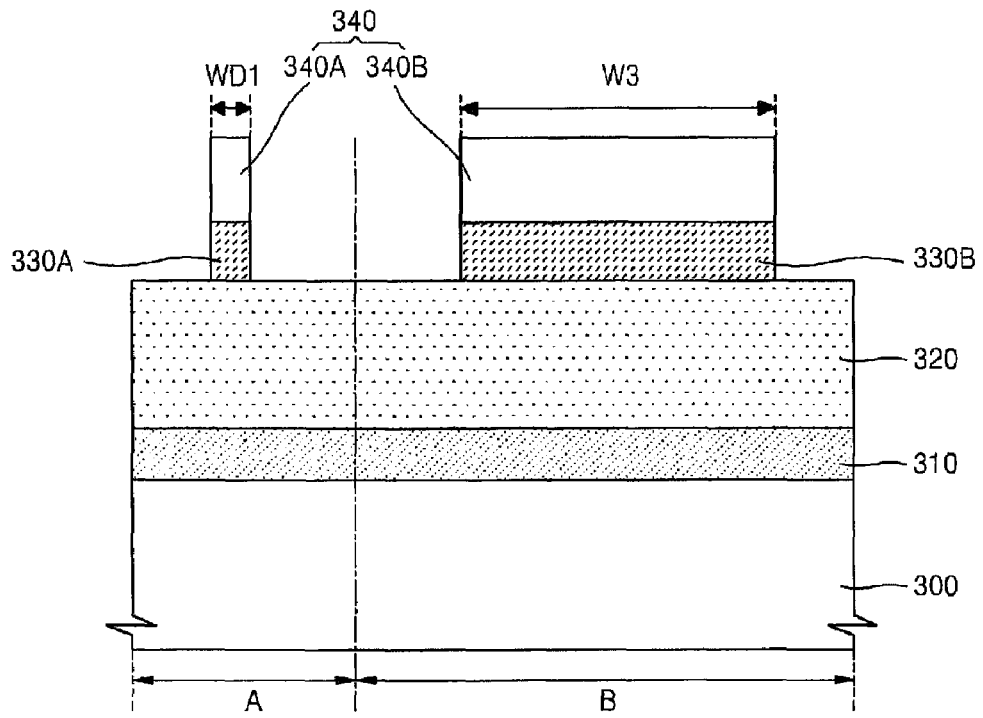

Referring to FIG. 3B, the etching mask layer 330 is etched using the mask pattern 340 as an etch mask in the first region A and the second region B, thereby forming a sacrificial film etching mask pattern 330A in the first region A and a wide-width etching mask pattern 330B in the second region B. Consequently, the width of the mask pattern 340 is transcribed to the etching mask layer 330, and thus the sacrificial film etching mask pattern 330A formed in the first region A has a width corresponding to the width WD1 of the first mask pattern 340A and the wide-width etching mask pattern 330B formed in the second region B has a width corresponding to the third width W3 of the second mask portion 340B.

While the etching mask layer 330 is being etched to form the sacrificial film etching mask pattern 330A and the wide-width etching mask pattern 330B, the thickness of the mask pattern 340 may be reduced.

Figure 3C:
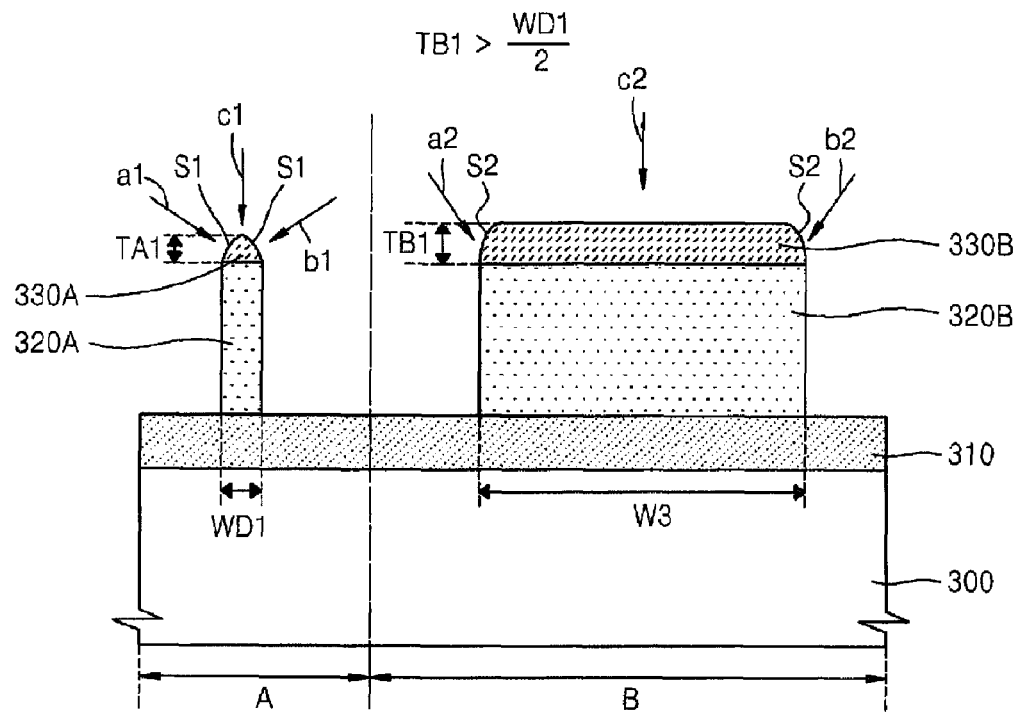
Figure 3D:
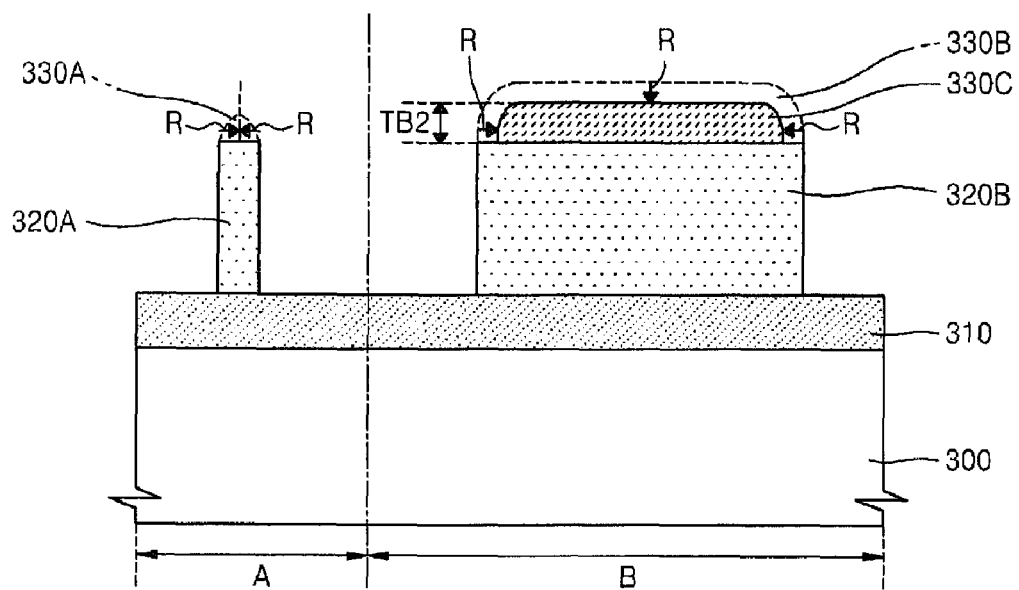

Referring to FIG. 3C, the dual mask layer 320 is etched using the mask pattern 340, the sacrificial film etching mask pattern 330A, and the wide-width etching mask pattern 330B as etch masks in the first region A and the second region B until the to-be-etched film 310 is exposed, and thus a first mask pattern 320A having a width corresponding to the fine width WD1 of the first mask portion 340A is formed in the first region A and a second mask pattern 320B having a width corresponding to the third width W3 of the second mask portion 340B is formed in the second region B.

While the dual mask layer 320 is being etched, the mask pattern 340 may be consumed and removed. However, although not shown in FIG. 3C, after the dual mask layer 320 is etched, a part of the second mask portion 340B may remain on the wide-width etching mask pattern 330B in the second region B.

While the dual mask layer 320 is being etched, the sacrificial film etching mask pattern 330A existing in the first region A and the wide-width etching mask pattern 330B existing in the second region B may be affected by the etching performed in various directions from a vertical direction, which is perpendicular to an extending direction of the main surface of the substrate 300, to a horizontal direction as indicated by arrows a1, b1, c1, a2, b2, and c2 in FIG. 3C. In other words, the sacrificial film etching mask pattern 330A and the wide-width etching mask pattern 330B are affected by the etching performed not only in directions c1 and c2, respectively, perpendicular to the main surface of the substrate 300 but also in inclined directions a1 and b1 and inclined directions a2 and b2, respectively. Consequently, as shown in FIG. 3C, the sacrificial film etching mask pattern 330A and the wide-width etching mask pattern 330B have inclined etched surfaces S1 and S2 on corresponding side walls, respectively. At this time, since the fine width WD1 of the sacrificial film etching mask pattern 330A is smaller than the third width W3 of the wide-width etching mask pattern 330B, as consumption of the inclined etched surfaces S1 in directions a1 and b1 or adjacent inclined directions (not shown) proceeds after the inclined etched surfaces S1 are formed, the inclined etched surfaces S1 of both side walls of the sacrificial film etching mask pattern 330A meet together on the upper surface of the sacrificial film etching mask pattern 330A in a relatively short period of time, and the amount of consumption of the side walls of the sacrificial film etching mask pattern 330A increases. Accordingly, an effect where an increase in the amount of consumption of the upper surface of the sacrificial film etching mask pattern 330A in the direction c1 is accelerated is obtained. This effect is referred to as a 3D etching effect. On the other hand, since the third width W3 of the wide-width etching mask pattern 330B is greater than the fine width WD1 of the sacrificial film etching mask pattern 330A, although consumption of the inclined etched surfaces S2 of the wide-width etching mask pattern 330B in directions a2 and b2 or adjacent inclined directions (not shown) proceeds after the inclined etched surfaces S2 are formed, the amount of consumption of the upper surface of the wide-width etching mask pattern 330B in the direction c2 until the etching of the dual mask layer 320 is completed is greatly less than the amount of consumption of the sacrificial film etching mask pattern 330A in the direction c1 due to the 3D etching effect.

Accordingly, even when the etching mask layer 330 is formed to have the same thickness in both the first region A and the second region B, the sacrificial film etching mask pattern 330A remaining on the first mask pattern 320A, has a thickness TA1 that is less than a thickness TB1 of the wide-width etching mask pattern 330B remaining on the second mask pattern 320B, after the first mask pattern 320A and the second mask pattern 320B are formed in the first region A and the second region B, respectively. The larger the difference between the third width W3 and the fine width WD1 is, the larger the difference between the thickness TA1 of the sacrificial film etching mask pattern 330A and the thickness TB1 of the wide-width etching mask pattern 330B may be.

In FIG. 3C, the dual mask layer 320 may be etched by dry etching. For example, if a carbon-contained layer is used as the dual mask layer 320 as described above with reference to FIG. 3A, a plasma etching process using a mixture of $O_2$ and Ar may be performed to etch the dual mask layer 320.

The first mask pattern 320A is used as a sacrificial film for double patterning to form fine patterns in the first region A, and the second mask pattern 320B is used as a part of an etch mask for an etching process of forming a wide-width pattern in the second region B.

The thickness of the etching mask layer 330 may be determined in the process described above with reference to FIG. 3A such that a first thickness, namely, the thickness TB1 of the wide-width etching mask pattern 330B in the second region B is greater than half $$\left(\text{that is, } \frac{WD1}{2}\right)$$

of the width WD1 of the sacrificial film etching mask pattern 330A in the first region A.

Referring to FIG. 3D, when the sacrificial film etching mask pattern 330A remains on the first mask pattern 320A and the wide-width etching mask pattern 330B remains on the second mask pattern 320B, the dual mask layer 320 is etched until the sacrificial film etching mask pattern 330A in the first region. A is removed. To achieve this, only the sacrificial film etching mask pattern 330A and the wide-width etching mask pattern 330B may be etched isotropically until the sacrificial film etching mask pattern 330A is completely removed. The isotropic etching is performed under the condition that only the sacrificial film etching mask pattern 330A and the wide-width etching mask pattern 330B may be etched due to having higher etch selectivity than those of neighboring films. The isotropic etching may be wet etching or dry etching. For example, if the sacrificial film etching mask pattern 330A and the wide-width etching mask pattern 330B are formed of $SiO_2$ or SiON, a hafnium (HF) cleaning solution may be used to isotropically etch only the sacrificial film etching mask pattern 330A and the wide-width etching mask pattern 330B.

When the sacrificial film etching mask pattern 330A and the wide-width etching mask pattern 330B are isotropically etched until the sacrificial film etching mask pattern 330A in the first region A is completely removed, upper surfaces and side walls of the sacrificial film etching mask pattern 330A and the wide-width etching mask pattern 330B are etched uniformly the same amount, as indicated by dotted lines and arrow R of FIG. 3D. In other words, at the moment when the sacrificial film etching mask pattern 330A in the first region A is completely removed, the wide-width etching mask pattern 330B in the second region B is consumed by a predetermined thickness from exposed surfaces. For example, a thickness corresponding to at least ½

$$\left(\text{that is, } \frac{WD1}{2}\right)$$

of the width WD1 of the sacrificial film etching mask pattern 330A in the first region A. Consequently, the sacrificial film etching mask pattern 330A is completely removed in the first region A, and thus an upper surface of the first mask pattern 320A below the sacrificial film etching mask pattern 330A is exposed. A residual etching mask pattern 330C corresponding to a portion of the wide-width etching mask pattern 330B which remains on the second mask pattern 320B after the isotropic etching of the wide-width etching mask pattern 330B is formed in the second region B. The residual etching mask pattern 330C has a second thickness TB2 that is smaller than the first thickness TB1 of the wide-width etching mask pattern 330B.

Figure 3E:
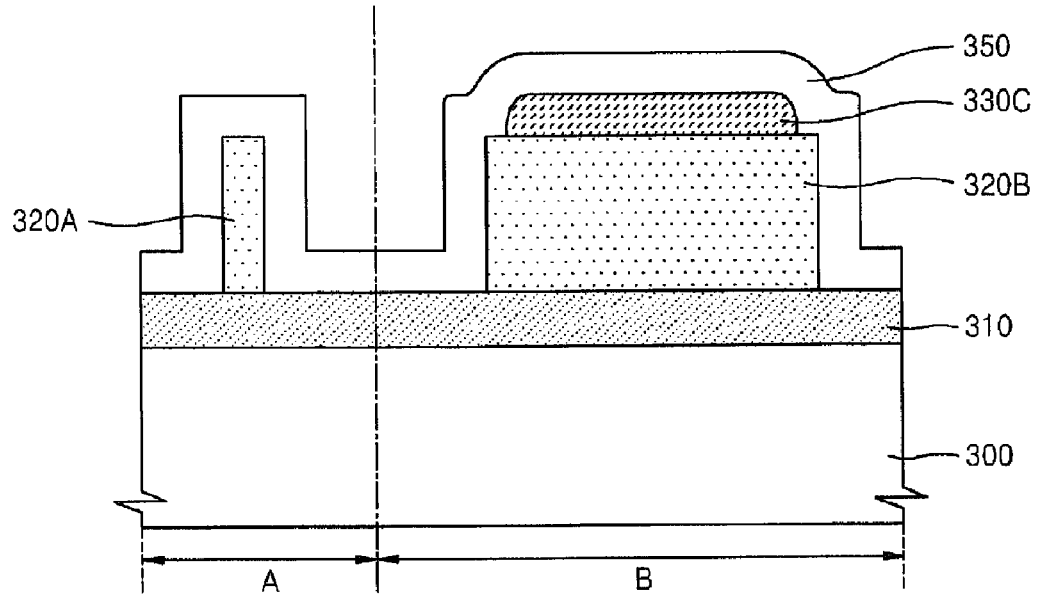

Referring to FIG. 3E, a spacer mask layer 350 is formed to cover exposed surfaces of the first mask pattern 320A in the first region A, exposed surfaces of the second mask pattern 320B and the residual etching mask pattern 330C in the second region B, and an exposed surface of the to-be-etched film 310. The spacer mask layer 350 may have the same thickness in both the first region A and the second region B.

The thickness of the spacer mask layer 350 may be determined according to the first width W1 of the first pattern 210 (see FIG. 2) which is desired to be formed in the first region A. The thickness of the spacer mask layer 350 may be the same as the first width W1 or different therefrom.

The spacer mask layer 350 may be formed of a material having an etch selectivity different from those of the residual etching mask pattern 330C, the first and second mask patterns 320A and 320B, and the to-be-etched film 310. For example, the spacer mask layer 350 may be formed of an oxide film. Atomic layer deposition (ALD) may be performed to form the spacer mask layer 350 to have a uniform thickness on the substrate 300.

Figure 3F:
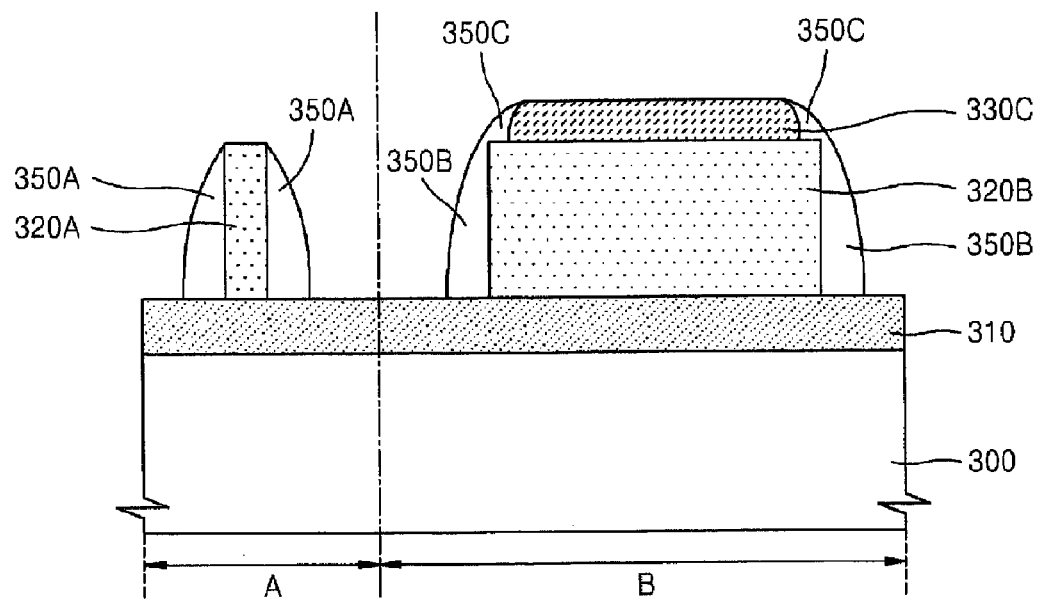

Referring to FIG. 3F, the spacer mask layer 350 is etched until the upper surfaces of the first mask pattern 320A and the to-be-etched film 310 are exposed, thereby forming first spacers 350A covering sidewalls of the first mask pattern 320A in the first region A and forming second spacers 350B covering sidewalls of the second mask pattern 320B in the second region. B. As illustrated in FIG. 3F, third spacers 350C may also be formed on sidewalls of the residual etching mask pattern 330C.

The first spacers 350A may be used as an etch mask for doubling the pattern density of the first region A. The second spacers 350B may be used as a part of an etch mask for forming a wide pattern, which has a greater width than a pattern formed in the first region A, in the second region B.

In the process of FIG. 3F, in order to etch the spacer mask layer 350, a CxFy gas (where x and y denote integers ranging from 1 to 10) or a CHxFy gas (where x and y denote integers ranging from 1 to 10) may be used as a main etch gas. Alternatively, at least one gas selected from either $O_2$ gas or Ar gas is mixed with the main etch gas and used to etch the spacer mask layer 350. For example, $C_3F_6$, $C_4F_6$, $C_4F_8$, or $C_5F_8$ may be used as the CxFy gas. For example, $CHF_3$ or $CH_2F_2$ may be used as the CHxFy gas. If the $O_2$ gas is added to the main etch gas, the $O_2$ gas functions to remove a polymer byproduct generated during etching and to dissolve the CxFy gas. If the Ar gas is added to the main etch gas, the Ar gas is used as a carrier gas and helps ion bombarding to occur. The spacer mask layer 350 may be etched in a plasma atmosphere, wherein plasma of an etch gas selected from among the aforementioned etch gases is generated within an etch chamber. In some cases, the spacer mask layer 350 may be etched in the atmosphere of a selected etch gas, wherein plasma is not generated within the etch chamber, and thus there no ion energy exist. For example, the spacer mask layer 350 may be etched using a mixture of $C_4F_6$, $CHF_3$, $O_2$, and Ar as an etch gas. In this case, while $C_4F_6$, $CHF_3$, $O_2$, and Ar are being supplied so that a volume ratio of $C_4F_6$:$CHF_3$:$O_2$:Ar is about 1:6:2:14, a plasma-type dry etching process may be performed for several seconds to several tens of seconds under a pressure of about 30 mTorr.

Figure 3G:
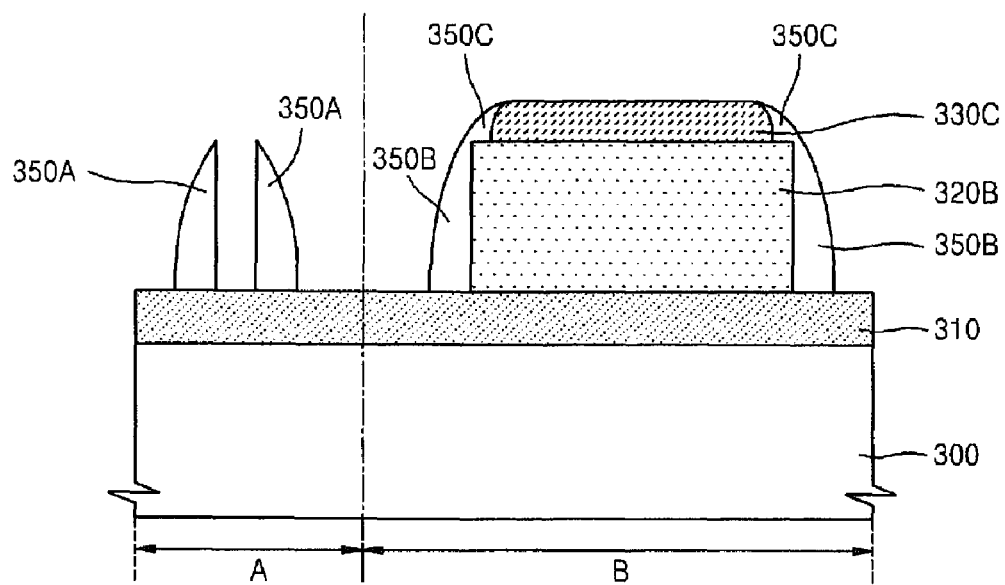

Referring to FIG. 3G, the first mask pattern 320A exposed in the first region A is removed to expose the to-be-etched film 310 through a space between the two first spacers 350A in the first region A.

In the second region B, the sidewalls of the second mask pattern 320B are covered with the second spacers 350B and the upper surface thereof is covered with the residual etching mask pattern 330C and the third spacers 350C, and thus while etching is being performed to remove the first mask pattern 320A in the first region A, the second mask pattern 320B in the second region B can be prevented from being consumed. Even when the third spacers 350C are not formed, that is, even when the sidewalls and the upper surface of the second mask pattern 320B are covered with only the second spacers 350B and the residual etching mask pattern 330C, after the first mask pattern 320A is etched isotropically, the second mask pattern 320B may maintain a thickness great enough be used as an etch mask when the to-be-etched film 310 below the second mask pattern 320B is etched in a subsequent process.

The first mask pattern 320A may be removed under the condition where the first spacers 350A in the first region A, the residual etching mask pattern 330C and the second spacers 350B in the second region B, and the to-be-etched film 310 are prevented from being etched.

If a carbon-contained layer is used as the first mask pattern 320A as described above with reference to FIG. 3A, ashing and stripping may be used to remove the first mask pattern 320A. Alternatively, the first mask pattern 320A may be removed by dry or wet etching according to the material used to form the first mask pattern 320A. For example, a mixture of $O_2$ gas and Ar gas may be used as an etch gas in order to remove the first mask pattern 320A according to a dry etching process. For example, a plasma-type dry etching process may be performed for several seconds to several tens of seconds at a pressure of about 1-30 mTorr and a temperature of about −10-40° C. while $O_2$ gas and Ar gas are being supplied so that a volume ratio of $O_2$:Ar is about 1:4-8. In this case, source power of about 400 W and bias power of about 150 W may be used.

Figure 3H:
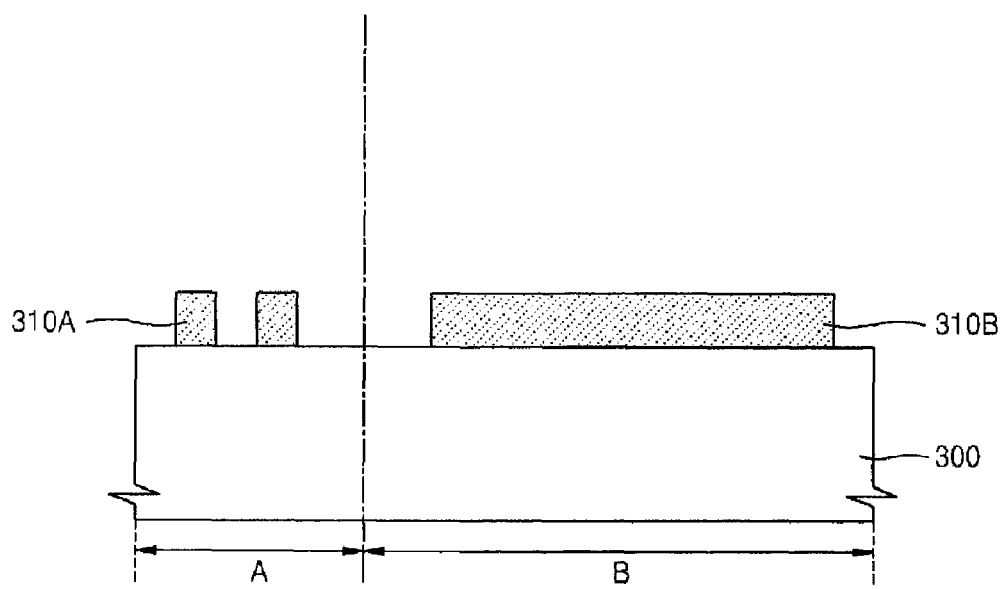

Referring to FIG. 3H, the to-be-etched film 310 is etched using the first spacers 350A as an etch mask in the first region A and using the second mask pattern 320B and the second spacers 350B, which covers the sidewalls of the second mask pattern 320B, as an etch mask in the second region B, thereby forming first patterns 310A and a second pattern 310B having different widths in the first region A and the second region B, respectively. Accordingly, unnecessary film may be removed from the upper surfaces of the first pattern 310A and the second pattern 310B. The first patterns 310A and the second pattern 310B may respectively constitute the first patterns 210 and the second pattern 220 of FIG. 2.

In the first process described above with reference to FIGS. 3A through 3H, in the first region A in which patterns having relatively small widths are formed, the first patterns 310A having small widths may be formed to have a doubled pattern density according to a double patterning process, in which the first spacers 350A formed on the sidewalls of the first mask pattern 320A are used as an etch mask. In the second region B, when wide patterns having greater widths than patterns formed in the first region A are formed, the second pattern 310B having a large width is formed using the second mask pattern 320B, which is formed simultaneously with the first mask pattern 320A, and the second spacers 350B, which are formed simultaneously with the first spacers 350A, as an etch mask. When patterns having different widths are formed simultaneously in the first region A and the second region B, a process of isotropically etching the sacrificial film etching mask pattern 330A and the wide-width etching mask pattern 330B is used to remove remaining sacrificial film etching mask pattern 330A, which is unnecessary, in the first region A and leave the residual etching mask pattern 330C for protecting the second mask pattern 320B, which is to be used as an etch mask, in the second region B. Accordingly, when patterns having different widths are formed simultaneously in the first region A and the second region B, no special photolithographic processes may be needed.

FIGS. 4A through 4D are cross-sectional views illustrating a second process from among the processes that can be used in performing the pattern forming method according to the present invention. In FIGS. 4A through 4D, a portion corresponding to a cross-section taken along a plane IIIA-IIIA' of FIG. 2 is illustrated in the first region A, and a portion corresponding to a cross-section taken along a plane IIIB-IIIB' of FIG. 2 is illustrated in the second region B.

Figure 4A:
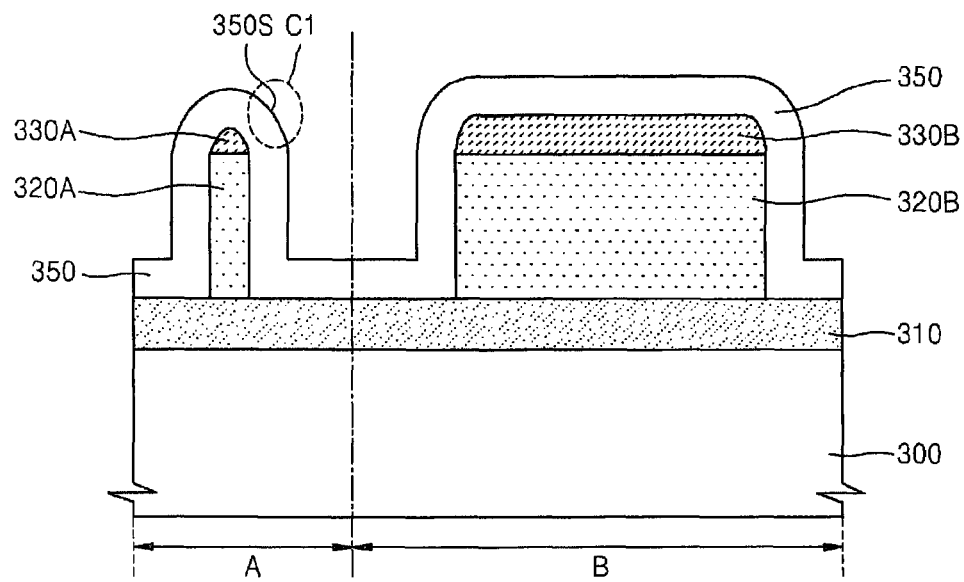
FIGS. 4A through 4D are cross-sectional views illustrating a second process from among the processes that can be used in performing the pattern forming method according to the present invention.

Referring to FIG. 4A, after a series of processes as described above with reference to FIGS. 3A through 3C are performed, a spacer mask layer 350 is formed in the same manner as the manner described above with reference to FIG. 3E. In contrast to the first process from among the processes that can be used in performing the pattern forming method according to the present invention, in FIG. 4A, when the spacer mask layer 350 is formed, the sacrificial film etching mask pattern 330A remains on the first mask pattern 320A and the wide-width etching mask pattern 330B also remains on the second mask pattern 320B, and the spacer mask layer 350 is formed to have a uniform thickness on exposed surfaces of the first mask pattern 320A, the sacrificial film etching mask pattern 330A, the second mask pattern 320B, the wide-width etching mask pattern 330B, and the to-be-etched film 310.

Figure 4B:
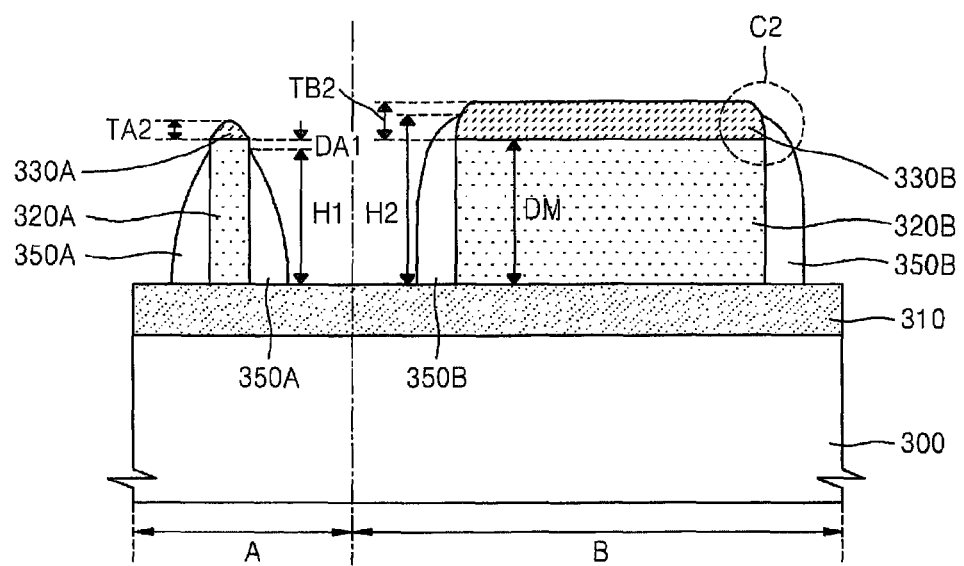

Referring to FIG. 4B, the spacer mask layer 350 is etched until the upper surface of the to-be-etched film 310 is exposed, thereby forming first spacers 350A covering sidewalls of the first mask pattern 320A in the first region A and forming second spacers 350B covering sidewalls of the second mask pattern 320B in the second region B.

The first spacers 350A may be used as an etch mask for doubling the pattern density of the first region A. The second spacers 350B may be used as a part of an etch mask for forming a wide pattern, which has a greater width than a pattern formed in the first region A, in the second region B.

While the spacer mask layer 350 is being etched, the speed of etching the spacer mask layer 350 is accelerated due to an inclined surface 350S of the spacer mask layer 350 in the first region A, and thus an etch rate of the spacer mask layer 350 in the first region A may be greater than that of the spacer mask layer 350 in the second region B. After the first spacers 350A and the second spacers 350B are formed, a rate of decrement of the thickness of the sacrificial film etching mask pattern 330A remaining on the first mask pattern 320A becomes greater than that of the wide-width etching mask pattern 330B remaining on the second mask pattern 320B, and thus a difference between a thickness TB2 of the wide-width etching mask pattern 330B and a thickness TA2 of the sacrificial film etching mask pattern 330A may increase. The height of each of the first spacers 350A formed on the to-be-etched film 310 in the first region A may be decreased to a height H1 that is less than a height H2 of each of the second spacers 350B formed in the second region B. Accordingly, the sacrificial film etching mask pattern 330A may be a distance DA1 apart from the first spacers 350A in the first region A, and the first mask pattern 320A may be exposed by a size corresponding to the distance DA1 between the sacrificial film etching mask pattern 330A and each of the first spacers 350A.

On the other hand, in the second region B, an etching speed of the spacer mask layer 350 around the sidewalls of the wide-width etching mask pattern 330B is less than that of the inclined surface 350S of the spacer mask layer 350 in the first region A, and thus the height of the second spacers 350B, starting from the upper surface of the to-be-etched film 310 in the second region B, is a height H2 that is greater than a distance DM between the upper surface of the to-be-etched film 310 and the bottom surface of the wide-width etching mask pattern 330B. Accordingly, as indicated by a dotted circle "C2" of FIG. 4B, the second spacers 350B and the wide-width etching mask pattern 330B may partially contact with each other. Thus, in the second region B, the second mask pattern 320B may not be exposed due to being completely covered by the second spacers 350B and the wide-width etching mask pattern 330B.

In the process of FIG. 4B, the spacer mask layer 350 may be etched using an etching condition as described above with reference to FIG. 3F.

Figure 4C:
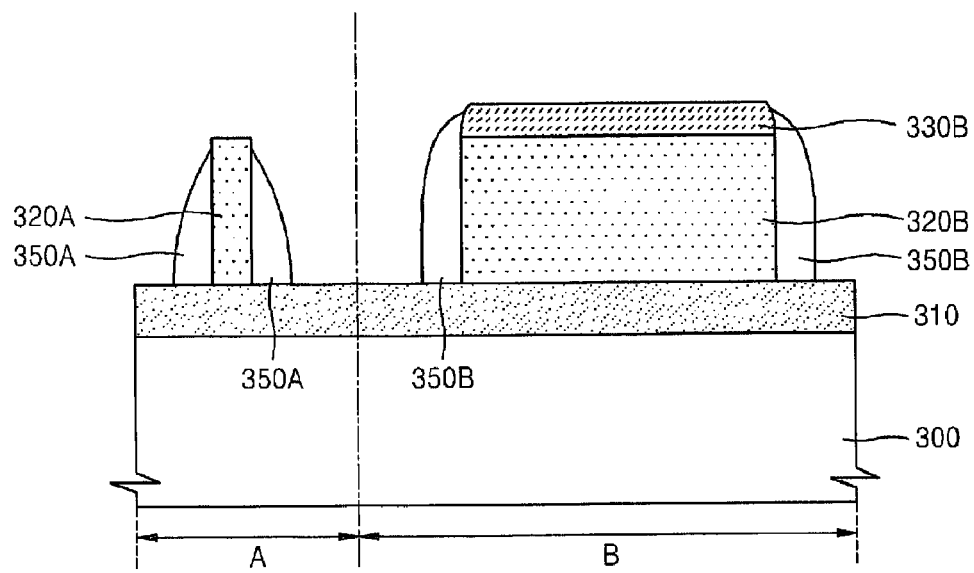

Referring to FIG. 4C, only the sacrificial film etching mask pattern 330A in the first region A from among the sacrificial film etching mask pattern 330A and the wide-width etching mask pattern 330B is removed so that the upper surface of only the first mask pattern 320A from among the first mask pattern 320A in the first region A and the second mask pattern 320B in the second region B is exposed.

The sacrificial film etching mask pattern 330A is removed using an etch corresponding to the etch selectivity of the sacrificial film etching mask pattern 330A different than that of each of the first and second mask patterns 320A and 320B, the first and second spacers 350A and 350B, and the to-be-etched film 310.

Since the sacrificial film etching mask pattern 330A has a size and a thickness smaller than a size and a thickness of the wide-width etching mask pattern 330B, even when the sacrificial film etching mask pattern 330A and the wide-width etching mask pattern 330B are formed of the same material, an etch rate of the sacrificial film etching mask pattern 330A is greater than that of the wide-width etching mask pattern 330B. Accordingly, at the moment when the sacrificial film etching mask pattern 330A is completely removed in the first region A, the wide-width etching mask pattern 330B remains on the upper surface of the second mask pattern 320B without a relatively large decrease in the thickness of the wide-width etching mask pattern 330B in the second region B.

In the process of FIG. 4C, the sacrificial film etching mask pattern 330A may be removed by dry or wet etching. For example, if the sacrificial film etching mask pattern 330A is formed of SiON or $Si_3N_4$, a CHxFy gas (where x and y denote integers ranging from 1 through 10) may be used as a main etch gas to remove the sacrificial film etching mask pattern 330A. Alternatively, a mixture of a CxFy gas (where x and y denote integers ranging from 1 through 10) and the CHxFy gas may be used as the main etch gas. If needed, $O_2$, Ar, or a halogen compound may be further included in the mixture. For example, to remove the sacrificial film etching mask pattern 330A, a mixture of $CH_2F_2$, $CHF_3$, $O_2$, and Ar may be used as an etch gas. In this case, while these gases are being supplied such that a volume ratio of $CH_2F_2$:$CHF_3$:$O_2$:Ar is about 4:1:5:9, a plasma-type dry etching process may be performed at a pressure of about 40 mTorr for several seconds to several tens of seconds.

The sacrificial film etching mask pattern 330A may be removed right after the process of FIG. 3E of etching the spacer mask layer 350 to faun the first spacers 350A and the second spacers 350B. At this time, the sacrificial film etching mask pattern 330A may be removed in-situ under the same etching condition and within the same etching chamber as the etching condition and etching chamber used for the etching of the spacer mask layer 350 of FIG. 3E. Even in this case, the same effect as the effect described above with reference to FIG. 3F can be obtained.

Figure 4D:
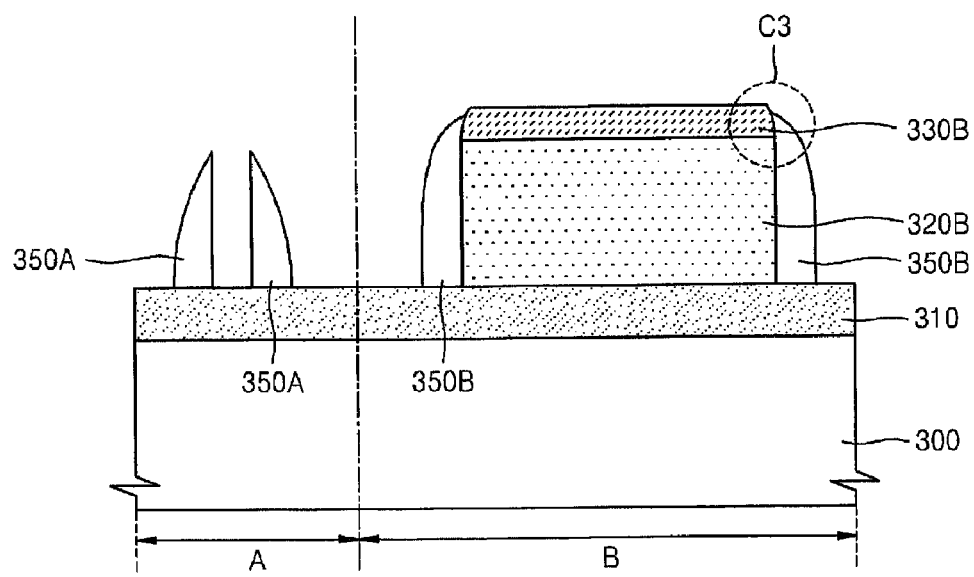

Referring to FIG. 4D, the first mask pattern 320A exposed in the first region A is removed to expose the to-be-etched film 310 through a space between the two first spacers 350A adjacent to each other in the first region A.

As indicated by a dotted circle C3 of FIG. 4D, since the second spacers 350B partially contact the wide-width etching mask pattern 330B in the second region B, the second mask pattern 320B is completely covered with the second spacers 350B and the wide-width etching mask pattern 330B, and thus is not exposed in the second region B. Accordingly, while the first mask pattern 320A is being removed in the first region A, the upper surface and sidewalls of the second mask pattern 320B existing in the second region B may be protected by the wide-width etching mask pattern 330B and the second spacers 350B, respectively.

The removal of the first mask pattern 320A may be performed under the condition that the first spacers 350A existing in the first region A, the wide-width etching mask pattern 330B and the second spacers 350B existing in the second region B, and the to-be-etched film 310 are prevented from being etched.

If a carbon-contained layer is used as the first mask pattern 320A as described above with reference to FIG. 3A, ashing and stripping may be used to remove the first mask pattern 320A. Alternatively, the first mask pattern 320A may be removed by dry or wet etching according to the material used to form the first mask pattern 320A. For example, a mixture of $O_2$ gas and Ar gas may be used as an etch gas in order to remove the first mask pattern 320A according to a dry etching process. For example, a plasma-type dry etching process may be performed for several seconds to several tens of seconds at a pressure of about 1-30 mTorr and a temperature of about −10-40° C. while $O_2$ gas and Ar gas are being supplied so that a volume ratio of $O_2$:Ar is about 1:4-8. In this case, source power of about 400 W and bias power of about 150 W may be used.

Thereafter, as described above with reference to FIG. 3H, the to-be-etched film 310 is etched using the first spacers 350A as an etch mask in the first region A and using the second mask pattern 320B and the second spacers 350B, which covers the sidewalls of the second mask pattern 320B, as an etch mask in the second region B, thereby forming first patterns 310A and a second pattern 310B having different widths in the first region A and the second region B, respectively.

In the second process described above with reference to FIGS. 4A through 4D, in the first region A in which patterns having relatively small widths are formed, the first patterns 310A having small widths may be formed to have a doubled pattern density according to a double patterning process, in which the first spacers 350A formed on the sidewalls of the first mask pattern 320A are used as an etch mask. In the second region B, when wide patterns having widths greater than patterns formed in the first region A are formed, the second pattern 310B having a large width is formed using the second mask pattern 320B, which is formed simultaneously with the first mask pattern 320A, and the second spacers 350B, which are formed simultaneously with the first spacers 350A, as an etch mask. When patterns having different widths are formed simultaneously in the first region A and the second region B, a difference between the fact that the first region A including the first patterns 310A having small widths is easily affected by a 3D etching effect obtained due to the small width of a pattern and the fact that the second region B including the second pattern 310B having a large width is hardly affected by the 3D etching effect is used. Accordingly, when patterns having different widths are formed simultaneously in the first region A and the second region B, no special photolithographic processes may be needed.

Figure 5A:
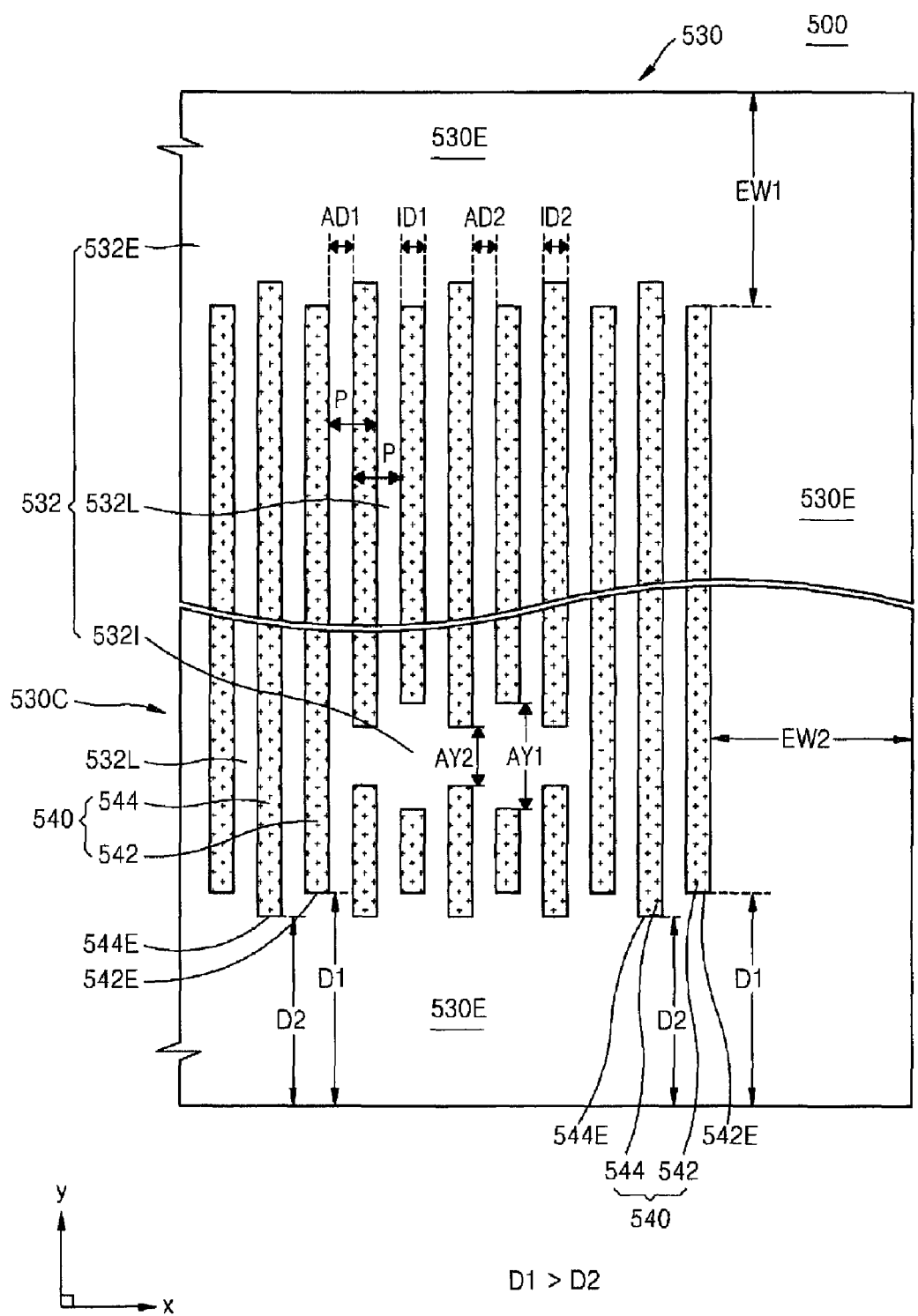
FIG. 5A is a layout of a structure of a part of a semiconductor device according to an embodiment of the present invention.

FIG. 5A is a layout of a structure of a part of a semiconductor device 500 according to an embodiment of the present invention.

FIG. 5A illustrates a layout of an active region 532 defined by a plurality of isolation films 540 in a part of a cell array region 530 in which the cell array 30 of the memory system 100 of FIG. 1 is formed.

In FIG. 5A, the cell array region 530 includes an edge portion 530E corresponding to an edge of the cell array region 530, and a center portion 530C surrounded by the edge portion 530E. FIG. 5A illustrates a part of the cell array region 530 that includes edge portions of upper and lower sides of the cell array region 530 and an edge portion of a right side of the cell array region 530, which can be seen on the right side of FIG. 5A.

In the center portion 530C and the edge portion 530E of the cell array region 530, the active region 532 is defined by the plurality of isolation films 540.

The plurality of isolation films 540 may be a plurality of line patterns extending parallel to each other in a certain direction, for example, in direction y of FIG. 5A. Each of the plurality of isolation films 540 may have a width ID1 or ID2 equal to a width AD1 of each of a plurality of line-type active regions 532L. However, the present invention is not limited to the illustrated widths ID1, ID2, and AD1, and the widths of each of the plurality of line-type active regions 532L and the widths of the plurality of isolation films 540 may be set to various other values according to desired configurations.

The plurality of isolation films 540 includes a plurality of first isolation films 542 having first ends 542E apart from the outline of the cell array region 530 by a relatively long distance D1 in the edge portion 530E of the cell array region 530, and a plurality of second isolation films 544 having second ends 544E apart from the outline of the cell array region 530 by a relatively short distance D2 in the edge portion 530E of the cell array region 530. In the cell array region 530, the first isolation films 542 and the second isolation films 544 alternate with each other one by one and extend parallel to each other.

The plurality of first isolation films 542 may include two adjacent first isolation films 542 that are arranged in straight lines in a certain direction, for example, in direction y of FIG. 5A, and apart from each other by a distance AY1. The plurality of second isolation films 544 may include two adjacent second isolation films 544 that are arranged in straight lines in a certain direction, for example, in direction y of FIG. 5A, and apart from each other by a distance AY2. Regions corresponding to the distances AY1 and AY2 between the first isolation films 542 and between the second isolation films 544 may serve as non-pattern regions in which the isolation films 540 are not formed. The distance AY2 may be smaller than the distance AY1.

An edge active region 532E may be defined in the edge portion 530E of the cell array region 530.

The plurality of line-type active regions 532L may be defined by the plurality of isolation films 540 within at least a part of the center portion 530C of the cell array region 530, and extend in lines in direction y between the first and second isolation films 542 and 544 of the plurality of isolation films 540. The plurality of line-type active regions 532L may be arranged at equal intervals. The plurality of line-type active regions 532L may be repeated at a fine pitch P while having uniform widths AD1 or AD2 and having each of the isolation films 540 on both sides of each of the line-type active regions 532L in the center portion 530C of the cell array region 530.

A plurality of word lines (not shown) may extend on the plurality of line-type active regions 532L. The word lines may extend in a direction perpendicular to a direction in which the line-type active regions 532L extend (i.e., the perpendicular direction is x direction in FIG. 5A). The plurality of line-type active regions 532L and the plurality of word lines located on the line-type active regions 532L may form a plurality of cell strings.

In another part of the center portion 530C of the cell array region 530, for example, in the non-pattern regions corresponding to the distances AY1 and AY2 between the first isolation films 542 and between the second isolation films 544, island-type active regions 532I may be defined by adjacent first isolation films 542 and adjacent second isolation films 544. The island-type active regions 532I may be connected to parts of the plurality of line-type active regions 532L. The widths AY1 of the island-type active regions 532I may be defined by respective ends of two adjacent first isolation films 542 arranged the distance AY1 apart from each other in a straight line in direction y from among the plurality of first isolation films 542, wherein the respective ends face each other. The widths AY2 of the island-type active regions 532I may be defined by respective ends of two adjacent second isolation films 544 arranged the distance AY2 apart from each other in a straight line in direction y from among the plurality of second isolation films 544, wherein the respective ends face each other. Accordingly, the island-type active regions 532I may include areas having different widths AY1 and AY2 in a predetermined direction (for example, y direction in FIG. 5A).

In the island-type active regions 532I, potential control wells (not shown) may be formed to control the potential of a well on which a plurality of cell strings are formed within the cell array region 530. Contacts (not shown) connected to potential control lines (not shown) may be formed on the potential control wells formed on the island-type active regions 532I. By defining the active region 532 of FIG. 5A according to a process as described later with reference to FIGS. 6A, 6B, and 6C through to FIGS. 11A, 11B, and 11C, or a process as described later with reference to FIGS. 12A, 12B, and 12C through to FIGS. 14A, 14B, and 14C, the island-type active regions 532I for forming potential control wells may be easily defined according to a simple process without performing a complicate trimming process.

Figure 5B:
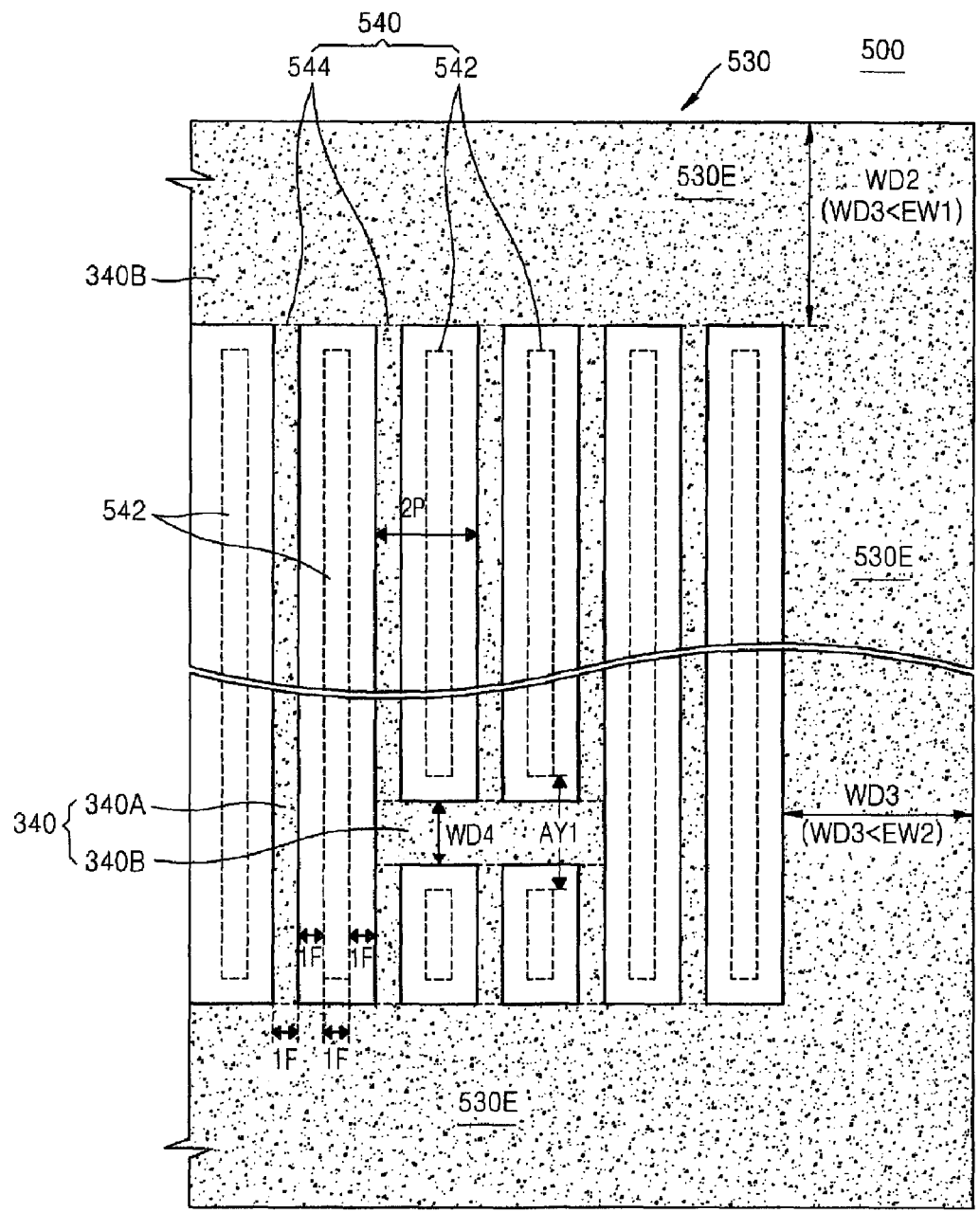
FIG. 5B is a plan view of a mask pattern that can be formed primarily according to a photolithographic process in order to define an active region illustrated in FIG. 5A, which has a pattern density doubled by double patterning, in a center portion of a cell array region by using a method according to the present invention.

FIG. 5B is a plan view of a mask pattern 340 that can be formed primarily according to a photolithographic process in order to define the active region 532 of FIG. 5A, which has a pattern density doubled by double patterning, in the center portion 530C of the cell array region 530 by using a method according to the present invention.

In order to facilitate the understanding of the present invention, FIG. 5B illustrates the isolation films 540 of FIG. 5A which are desired to be formed.

In the center portion 530C of the cell array region 530, the mask pattern 340 including a plurality of first mask portions 340A each having a width of 1F and being formed at intervals of a pitch 2P, which is twice the fine pitch P, in the center portion 530C of the cell array region 530 is formed to define the plurality of line-type active regions 532L each having the minimum feature size 1F of a memory cell. The mask pattern 340 may also include a second mask portion 340B which is located in the edge portion 530E of the cell array region 530 and a region where the island-type active regions 532I are to be defined and which has a relatively large width.

The layout of the mask pattern 340 illustrated in FIG. 5B may be applied equally to both the pattern forming method according to the present invention using the first process of FIGS. 3A through 3H and the pattern forming method according to the present invention using the second process of FIGS. 4A through 4D.

Figure 6A:
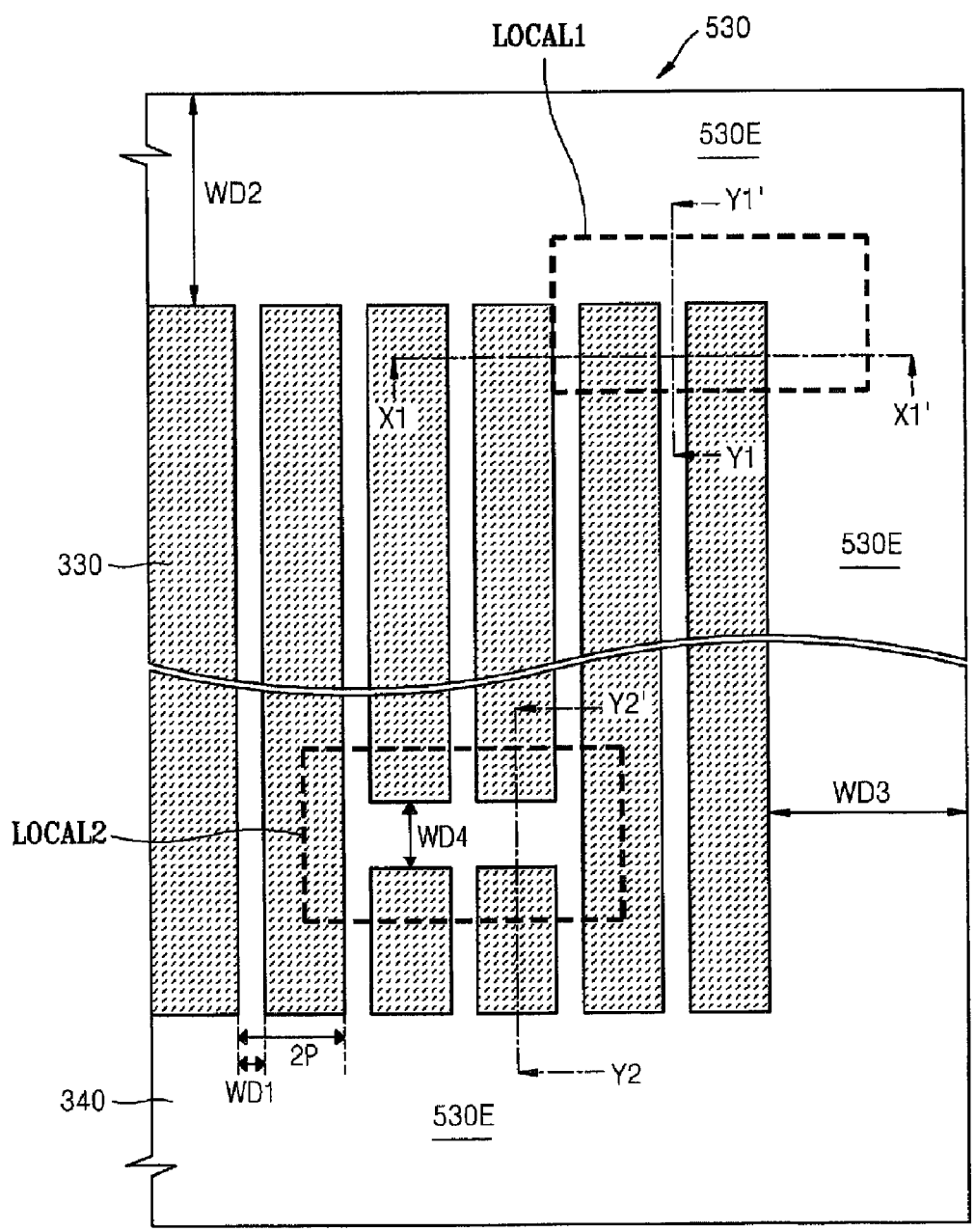
Figure 10B:
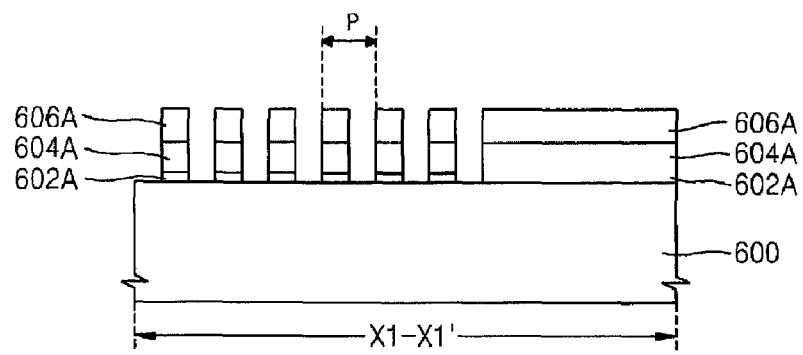
Figure 10C:
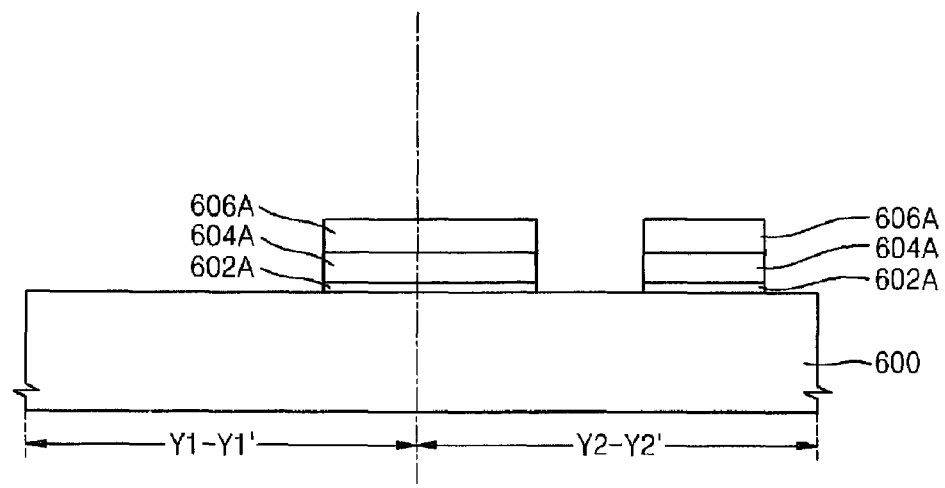
Figure 11B:
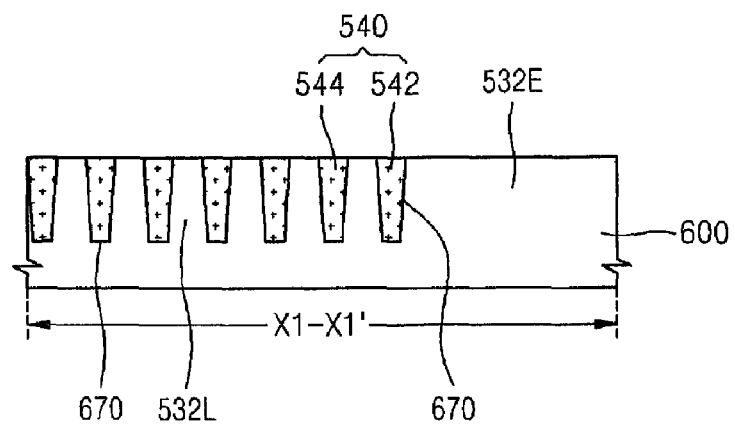
Figure 11C:
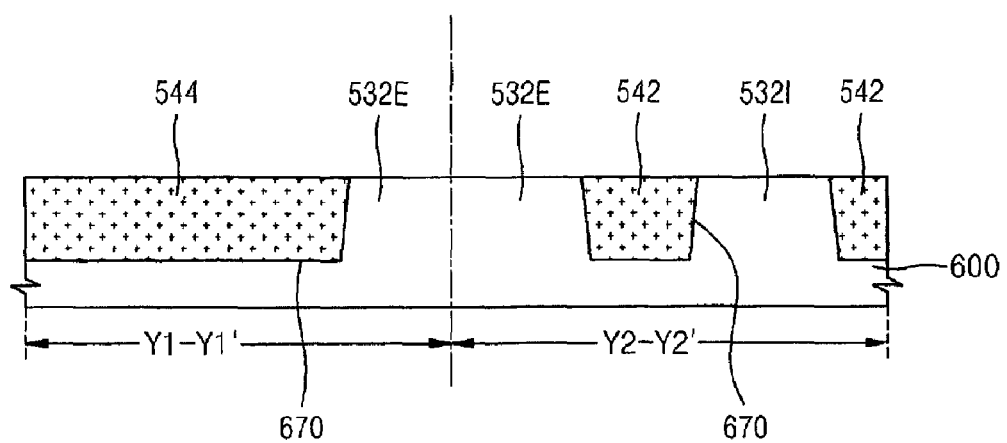

FIG. 6A through to FIG. 11C are views illustrating a method of manufacturing the semiconductor device 500 of FIG. 5A according to the first process illustrated in FIGS. 3A through 3H. More specifically, FIGS. 6A, 7A, 8A, 9A, 10A, and 11A are plan views illustrating some region of the semiconductor device 500 of FIG. 5A. FIGS. 6B, 7B, 8B, 9B, 10B, and 11B are cross-sections taken along a plane X1-X1' of FIGS. 6A, 7A, 8A, 9A, 10A, and 11A, respectively, and FIGS. 6C, 7C, 8C, 9C, 10C, and 11C are cross-sections taken along planes Y1-Y1' and Y2-Y2' of FIGS. 6A, 7A, 8A, 9A, 10A, and 11A, respectively. Like reference numerals in FIGS. 3A through 3H and FIGS. 6A through 11C denote like elements, and thus their description will be omitted.

Figure 6B:
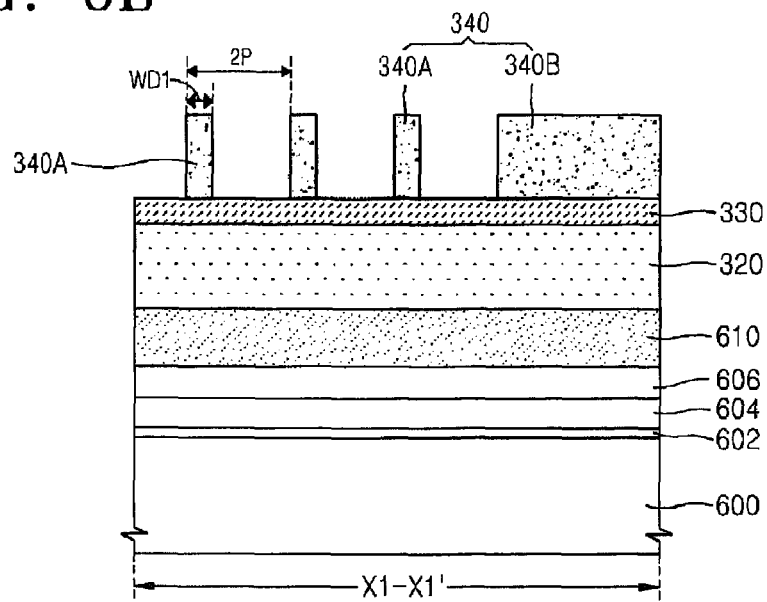
Figure 6C:
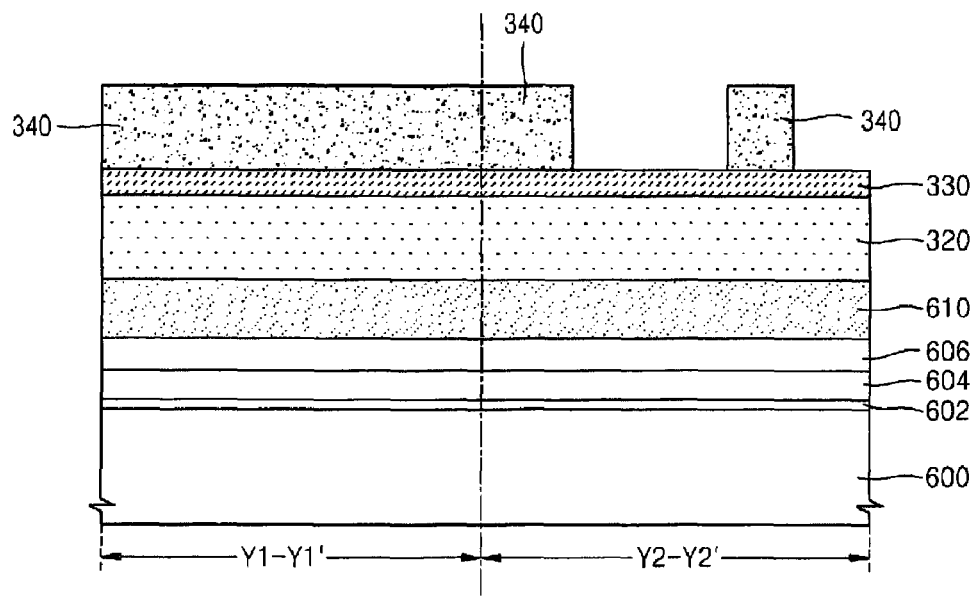

Referring to FIGS. 6A, 6B, and 6C, a substrate 600 having a device region is prepared. The device region may correspond to the cell array region 530 of FIG. 5A. The cell array region 530 includes the edge portion 530E and the center portion 530C surrounded by the edge portion 530E.

A pad oxide film 602 is formed on the cell array region 530 of the substrate 600. A first hard mask layer 604, a second hard mask layer 606, and a buffer mask layer 610 are sequentially formed on the pad oxide film 602.

The substrate 600 may be a typical substrate such as a silicon substrate.

Each of the first and second hard mask layers 604 and 606 may be a single-layered structure. Alternatively, each of the first and second hard mask layers 604 and 606 may be a multi-layered structure obtained by stacking at least two hard mask layers having different etching characteristics in regards to predetermined etching conditions. For example, the first hard mask layer 604 may be a silicon nitride layer, and the second hard mask layer 606 may be a silicon oxide layer. In some cases, the buffer mask layer 610 may be omitted. If the buffer mask layer 610 is formed, the buffer mask layer 610 may be a silicon nitride layer or a polysilicon layer.

Thereafter, in a method as described above with reference to FIG. 3A, the dual mask layer 320 and the etching mask layer 330 are formed sequentially on the buffer mask layer 610, and a mask pattern 340 is formed on the etching mask layer 330.

For example, if the buffer mask layer 610 is a silicon nitride layer, the dual mask layer 320 may be a polysilicon layer and the etching mask layer 330 may be a silicon oxide layer. If the buffer mask layer 610 is a polysilicon layer, the dual mask layer 620 may be a carbon-contained layer as described above with reference to FIG. 3A and the etching mask layer 330 may be a silicon oxide layer.

The materials used to form the first hard mask layer 604, the second hard mask layer 606, the buffer mask layer 610, the dual mask layer 320, and the etching mask layer 330 are not limited to these illustrated materials. Every adjacent film may be formed of materials having different etch selectivities with respect to a predetermined etching condition.

The mask pattern 340 may have the same structure as the structure of the mask pattern 340 illustrated in FIG. 5B. The mask pattern 340 includes a plurality of first mask portions 340A and a plurality of second mask portions 340B. The plurality of first mask portions 340A may be formed to have a pitch 2P, which is twice the pitch P of isolation trenches desired to be formed on the substrate 600, in the center portion of the cell array region 530. The plurality of second mask portions 340B may be formed to cover the edge portion 530E of the cell array region 530 and portions where the island-type active regions 532I are to be defined from among the entire area of the center portion 530C of the cell array region 530.

The width WD1 of each of the plurality of first mask portions 340A may be the same as or different from widths ID1 or ID2 (see FIG. 5A) of the isolation films 540, which are desired to be formed on the substrate 600, in direction x. The second mask portions 340B may be formed to have a width WD2 or WD3 smaller than a width EW1 or EW2 of the edge active regions 532E formed on the edge portions 530E of the cell array region 530. The second mask portions 340B may be formed to have a width WD4 smaller than a width AY1 of each of the island-type active regions 532I.

A difference between the width WD1 of each of the first mask portions 340A and the width WD2, WD3, or WD4 of each of the second mask portions 340E is satisfied with a value that allows the wide-width etching mask pattern 330B in the second region B to be consumed by only some thickness from the exposed surface thereof even when the sacrificial film etching mask pattern 330A in the first region A is completely removed by isotropic etching the second region B, to thereby obtaining the residual etching mask pattern 330C on the second mask pattern 320B as illustrated above with reference to FIG. 3D. The larger the difference between the widths of the first and second mask portions 340A and 340B is, the more effectively such an etching result due to a difference in the widths of patterns as described above with reference FIG. 3D may be obtained.

FIGS. 7A, 8A, through to 11A illustrate plan views of regions indicated by "LOCAL 1" and "LOCAL 2" of FIG. 6A.

Figure 7B:
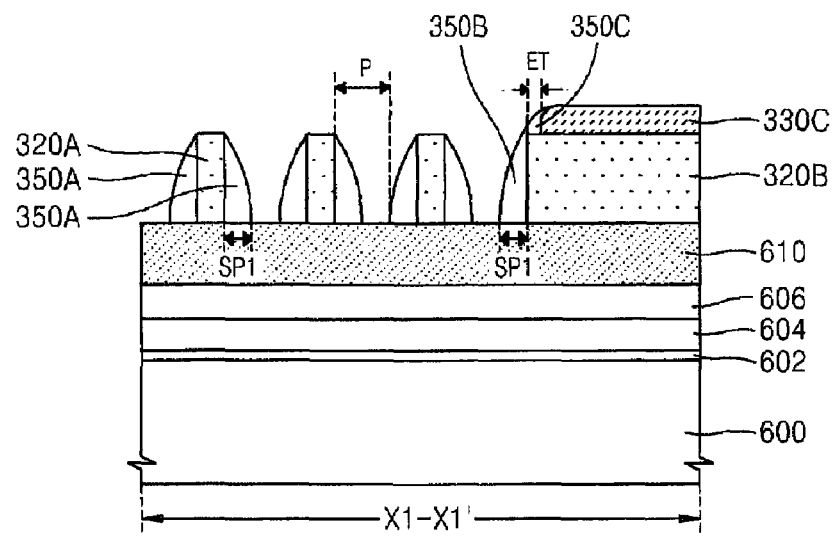
Figure 7C:
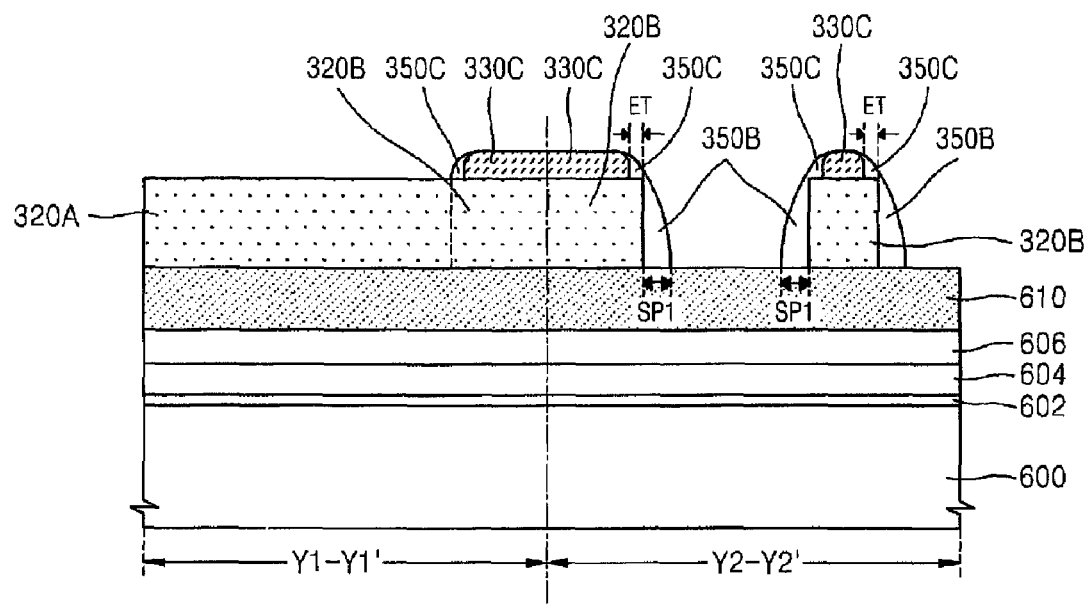

Referring to FIGS. 7A, 7B and 7C, a plurality of first spacers 350A covering sidewalls of the first mask patterns 320A and a plurality of second spacers 350B covering sidewalls of the second mask patterns 320B are formed in a method as described above with reference to FIGS. 3A through 3F.

As illustrated in FIG. 3F, third spacers 350C may be formed on sidewalls of the residual etching mask patterns 330C. During isotropically etching the sacrificial film etching mask pattern 330A illustrated in FIG. 3D, an amount by which the wide-width etching mask pattern 330B is consumed from corresponding sidewalls, that is, a thickness ET by which the wide-width etching mask pattern 330B is laterally removed, may be determined according to an etch target amount in the isotropical etching described above with reference to FIG. 3D. Accordingly, the width of the third spacers 350C formed on the upper surface of the second mask pattern 320B while covering the sidewalls of the residual etching mask patterns 330C depends on the thickness ET, which depends on the etch target amount.

Each of the first and second spacers 350A and 350B may be formed to cover the buffer mask layer 610 by a width SP1.

The first spacers 350A formed in the cell array region 530 may be repeated at the fine pitch P which is half the first pitch 2P (see FIG. 6A).

The sidewalls of the second mask pattern 320B are covered with the second spacers 350B, and the upper surface thereof is covered with the residual etching mask pattern 330C and the third spacers 350C.

In the center portion 530C surrounded by the edge portion 530E of the cell array region 530, the upper surfaces of the first mask patterns 320A and the upper surface of the buffer mask layer 610 are alternately exposed through gaps between the first spacers 350A and gaps between the first spacers 350A and the second spacers 350B. The exposed upper surfaces of the first mask patterns 320A and the exposed upper surface portions of the buffer mask layer 610 extend in a certain direction, that is, in direction y of FIG. 7A. A vertical distance dL between an end of each of the first mask patterns 320A in direction y and an end of each of the exposed upper surface portions of the buffer mask layer 610 in direction y may be equal to the width SP1 of each of the first and second spacers 350A and 350B that cover the buffer mask layer 610.

Figure 8B:
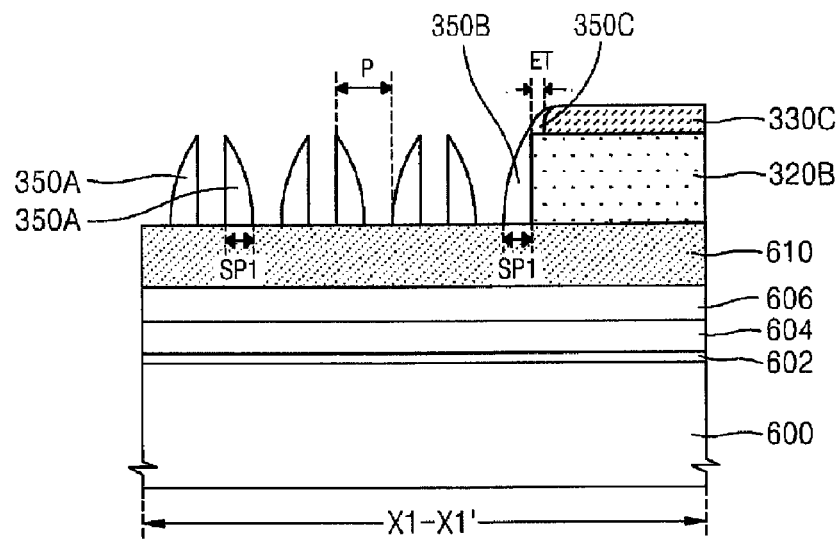
Figure 8C:
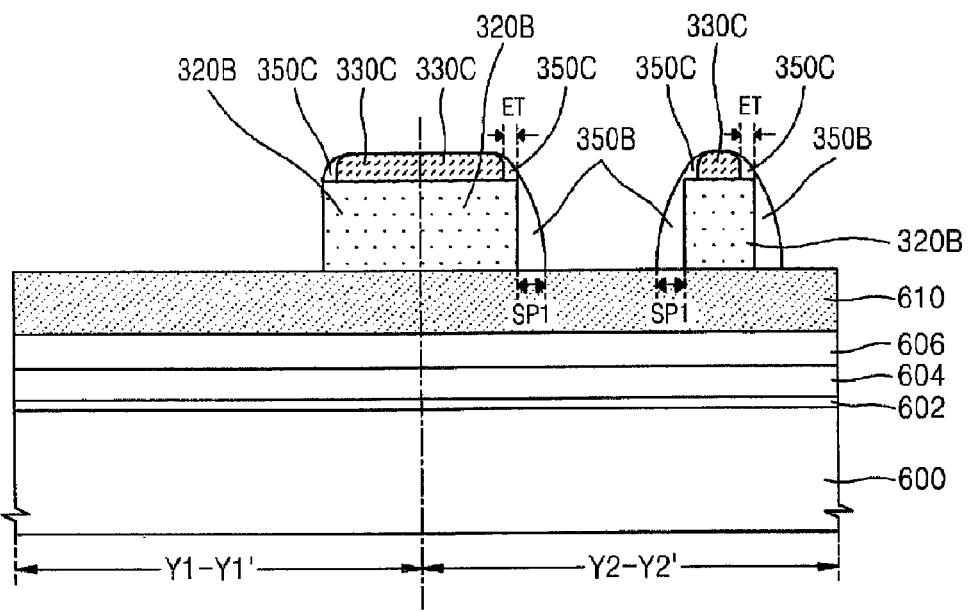

Referring to FIGS. 8A, 8B, and 8C, in a method as described above with reference to FIG. 3G, the first mask patterns 320A are removed to expose the buffer mask layer 610 through spaces between adjacent two first spacers 350A.

In the center portion 530C surrounded by the edge portion 530E of the cell array region 530, the upper surface of the buffer mask layer 610 is exposed through the gaps between the first spacers 350A and the gaps between the first spacers 350A and the second spacers 350B. The exposed upper surface portions of the buffer mask layer 610 extend in a certain direction, that is, in direction y of FIG. 8A. The exposed upper surface portions of the buffer mask layer 610 have two different lengths in direction y, alternately. A vertical distance dL between respective ends of every two adjacent exposed upper surface portions of the buffer mask layer 610 in direction y may be equal to the width SP1 of each of the first and second spacers 350A and 350B.

Figure 9B:
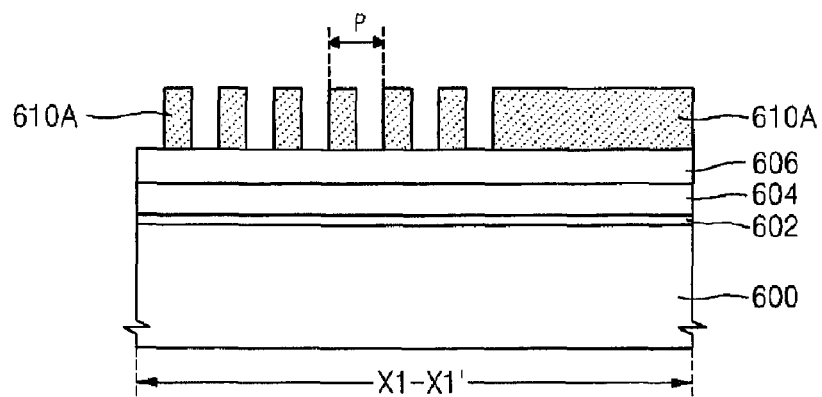
Figure 9C:
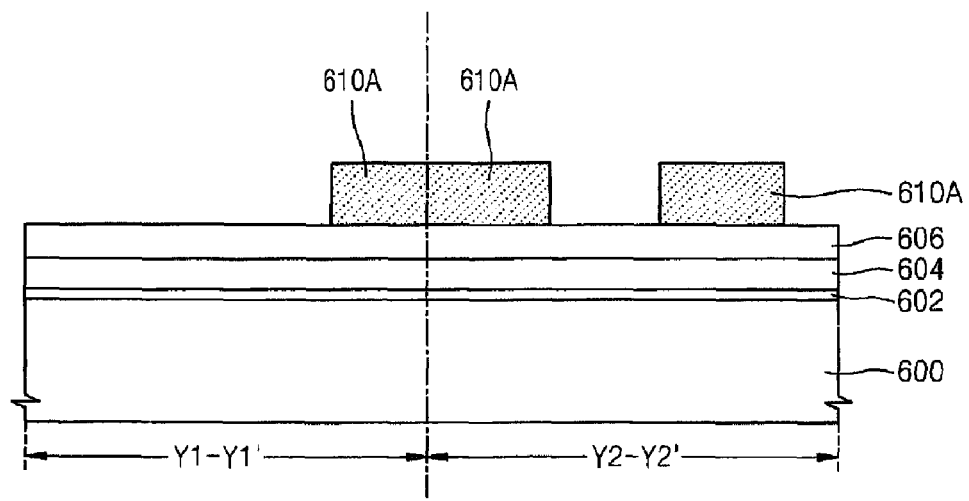

Referring to FIGS. 9A, 9B, and 9C, the buffer mask layer 610 is etched using the second mask pattern 320B and the second spacers 350B covering sidewalls of the second mask pattern 320B as an etch mask around a region in which the edge active region 532E is to be formed in the edge portion 530E of the cell array region 530 and around a region in which the island-type active regions 532I are to be formed in the center portion 530C of the cell array region 530, and using the first spacers 350A as an etch mask around a region in which the plurality of line-type active regions 532L are to be formed in the center portion 530C of the cell array region 530. As a result, a buffer mask pattern 610A having a plurality of apertures through which the second hard mask layer 606 is exposed is formed.

Although not shown in FIGS. 9B and 9C, after the buffer mask pattern 610A is formed, the first spacers 350A, parts of the second mask pattern 320B, and the second spacers 350B may remain on the buffer mask pattern 610A.

A plurality of portions of the second hard mask layer 606 which are exposed through the apertures of the buffer mask pattern 610A extend parallel to each other in a certain direction, that is, in direction y of FIG. 9A. The exposed portions of the second hard mask layer 606 have two different lengths in direction y, alternately. A vertical distance dL between respective ends of every two adjacent exposed portions of the second hard mask layer 606 in direction y may be equal to the width SP1 of each of the first and second spacers 350A and 350B.

Referring to FIGS. 10A, 10B, and 10C, the second hard mask layer 606 and the first hard mask layer 604 are sequentially etched using the buffer mask pattern 610A as an etch mask, thereby forming a first hard mask pattern 604A and a second hard mask pattern 606A. When the first hard mask layer 604 is etched, the second hard mask pattern 606A may serve as an etch mask. While the first hard mask layer 604 is being etched, the pad oxide film 602 is also etched, and thus a pad oxide film pattern 602A may be formed and the substrate 600 may be exposed between the patterns of the first hard mask pattern 604A and the second hard mask pattern 606A.

Although not shown in FIGS. 10B and 10C, after the first hard mask pattern 604A and the second hard mask pattern 606A are formed, parts of the buffer mask pattern 610A may remain on the second hard mask pattern 606A.

A plurality of portions of the substrate 600 which are exposed through the second hard mask pattern 606A extend parallel to each other in a certain direction, that is, in direction y of FIG. 10A. The exposed portions of the substrate 600 have two different lengths in direction y, alternately. A vertical distance dL between respective ends of every two adjacent exposed portions of the substrate 600 in direction y may be equal to the width SP1 of each of the first and second spacers 350A and 350B.

Referring to FIGS. 11A, 11B, and 11C, the exposed portions of the substrate 600 are etched using the first hard mask pattern 604A and the second hard mask pattern 606A, thereby forming a plurality of trenches 670 in the substrate 600.

Thereafter, an insulation material is deposited on the substrate 600 to have a thickness such that the trenches 670 are filled completely, and then is planarized by chemical mechanical polishing (CMP), thereby forming isolation films 540 in the trenches 670. Then, unnecessary films are removed from the upper surface of the substrate 600 so that the upper surface of the substrate 600 is exposed.

The isolation films 540 are a plurality of line patterns extending parallel to each other in a certain direction, that is, in direction y of FIG. 11A. The isolation films 540 include first isolation films 542 having first ends 542E which are relatively far from the outline of the cell array region 530 in the edge portion 530E of the cell array region 530, and second isolation films 544 having second ends 544E which are relatively close to the outline of the cell array region 530 compared with the first ends 542E of the first isolation films 542. In the cell array region 530, the first isolation films 542 and the second isolation films 544 alternate with each other one by one.

In the center portion 530C of the cell array region 530, the plurality of line-type active regions 532L of FIG. 5A are defined by adjacent first and second isolation films 542 and 544. In the center portion 530C of the cell array region 530, the island-type active regions 532I of FIG. 5A may be defined by adjacent first and second isolation films 542 and 544. The island-type active regions 532I are connected to some of the plurality of line-type active regions 532L.

The first isolation films 542 and the second isolation films 544 have two different lengths in direction y which alternate with each other. A vertical distance dL between the first end 542E of each of the first isolation films 542 and the second end 544E of each of the second isolation films 544 in direction y may be equal to the width SP1 of each of the first and second spacers 350A and 350B.

Figure 12B:
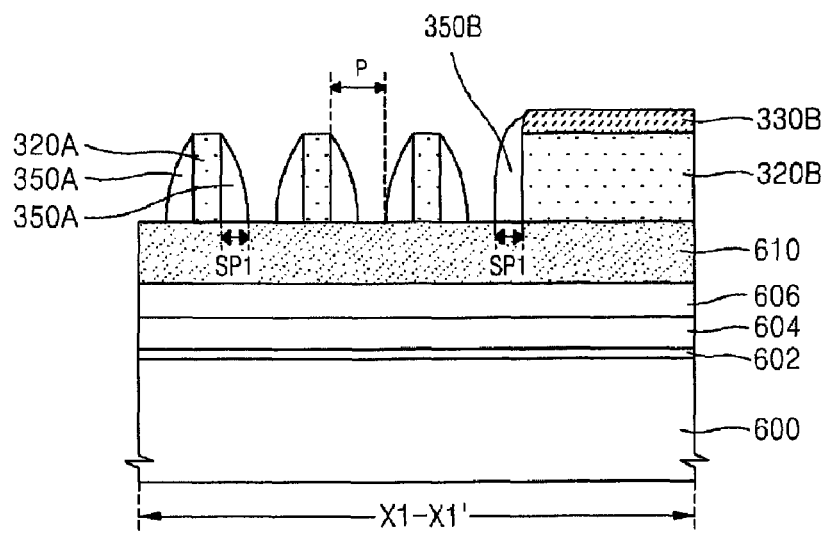
Figure 13B:
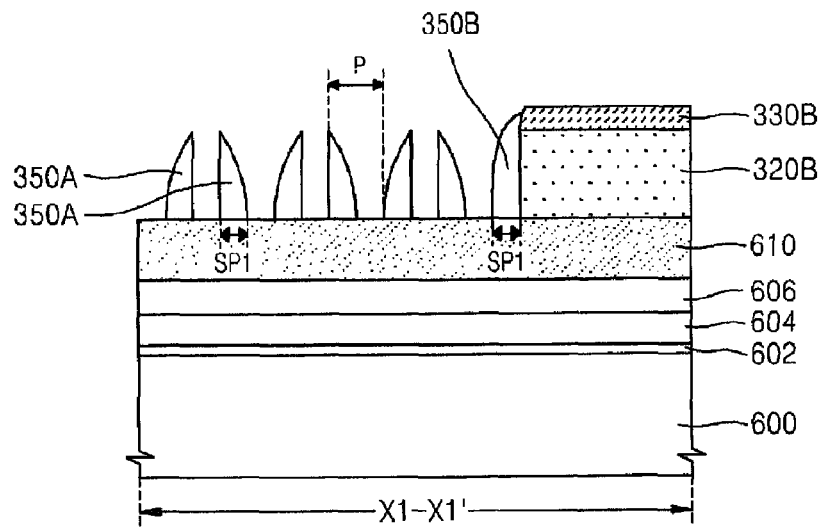
Figure 13C:
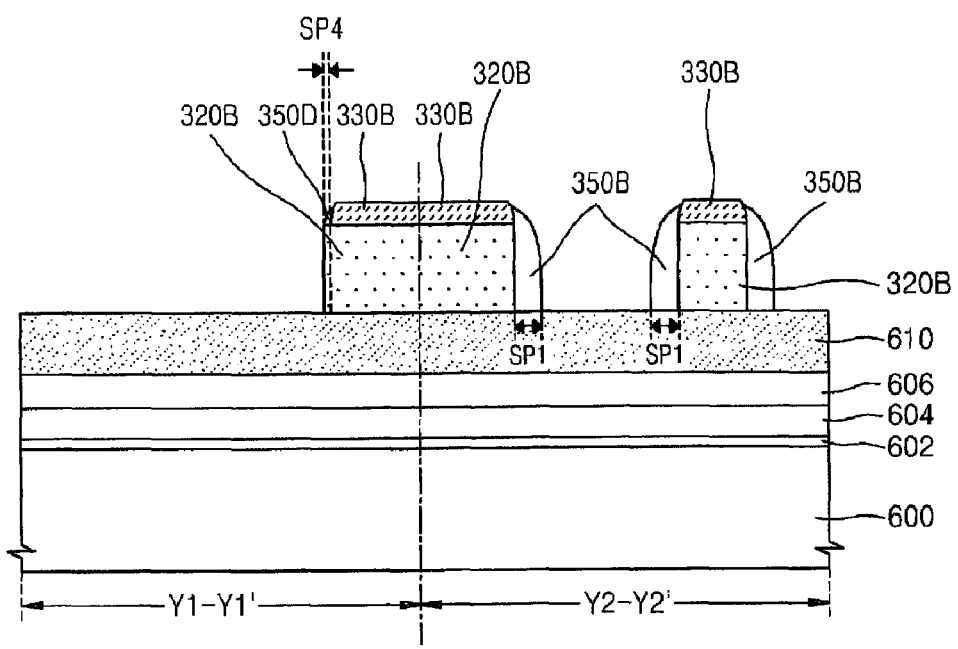
Figure 14B:
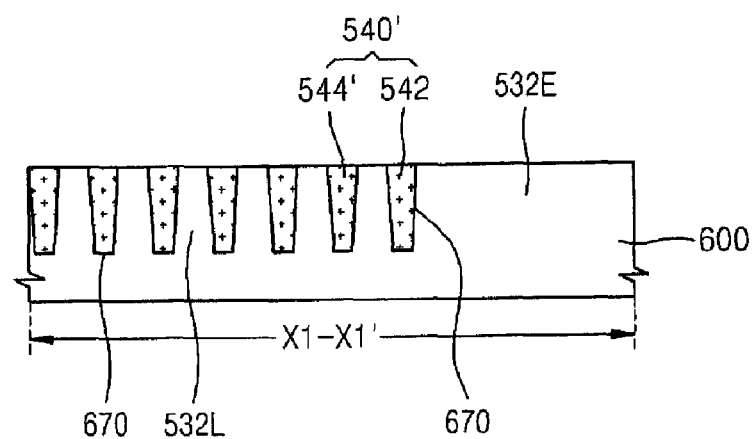
Figure 14C:
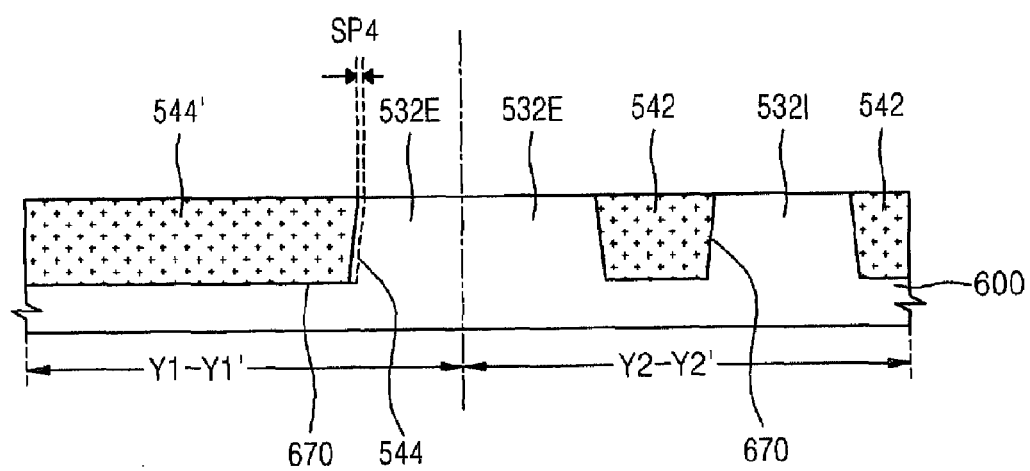

FIG. 12A through to FIG. 14C are views illustrating a method of manufacturing the semiconductor device 500 of FIG. 5A according to the second process illustrated in FIGS. 4A through 4D. More specifically, FIGS. 12A, 13A, and 14A are plan views of regions indicated as "LOCAL 1" and "LOCAL 2" of FIG. 6A from the part of the semiconductor device 500, FIGS. 12B, 13B, and 14B are cross-sections taken along a plane X1-X1' of FIGS. 12A, 13A, and 14A, and FIGS. 12C, 13C, and 14C are cross-sections taken along planes Y1-Y1' and Y2-Y2' of FIGS. 12A, 13A, and 14A. Same reference numerals as those in FIGS. 3A through 3H and FIGS. 4A through 4D denote the same elements, and thus their description will be omitted.

Figure 12C:
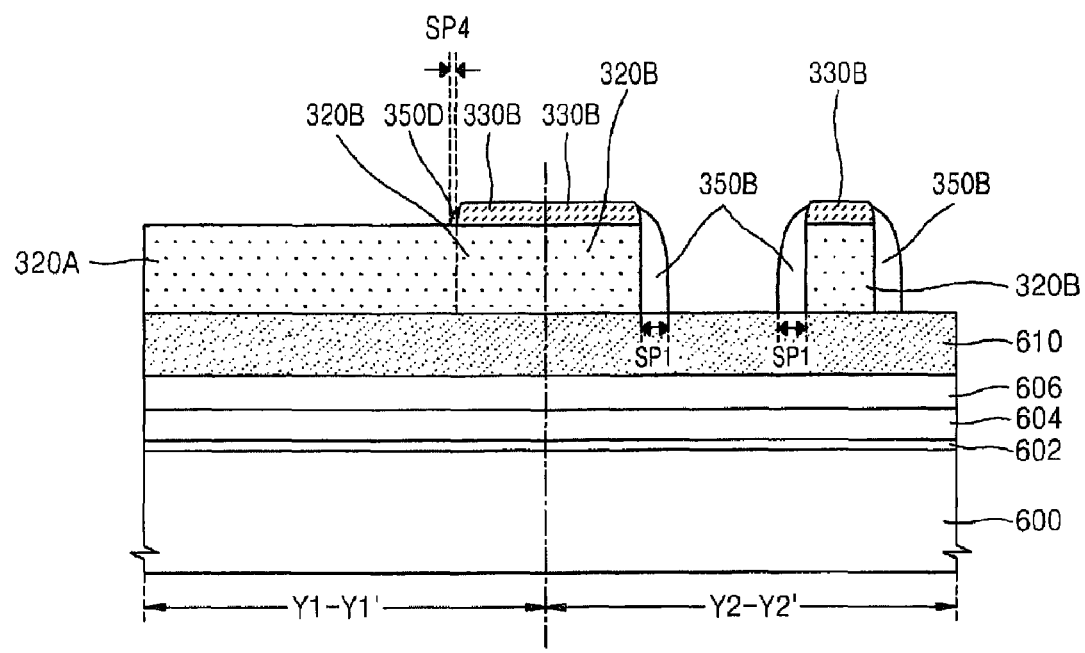

Referring to FIGS. 12A, 12B, and 12C, in a method as described above with reference to FIGS. 6A, 6B, and 6C, a pad oxide film 602, a first hard mask layer 604, a second hard mask layer 606, and a buffer mask layer 610 are sequentially formed on a cell array region 530 of a substrate 600, and then a dual mask layer 320 and an etching mask layer 330 are sequentially formed on the buffer mask layer 610.

Then, similar to what has been described above with reference to FIGS. 7A, 7B, and 7C, a plurality of first spacers 350A and a plurality of second spacers 350B are formed. In the current embodiment, the second process illustrated in FIGS. 4A through 4C is used to form the first spacers 350A and the second spacers 350B. Consequently, in contrast with the result of FIGS. 7A, 7B, and 7C obtained by the first process, a wide-width etching mask pattern 330B having nearly the same width as that of a second mask pattern 320B remains on the second mask pattern 320B. Fourth spacers 350D may be formed on sidewalls of the wide-width etching mask pattern 330B in portions close to the edge portion 530E of the cell array region 530 from among the upper surfaces of the first mask patterns 320A. Accordingly, a vertical distance dL2 between an end of a plurality of exposed portions of a plurality of first mask pattern 320A in direction y and an end of a plurality of exposed portions of the buffer mask layer 610 in direction y is less than the vertical distance dL illustrated in FIGS. 7A, 7B, and 7C by a width SP4 of each of the fourth spacers 350D.

Referring to FIGS. 13A, 13B, and 13C, in a method as described above with reference to FIGS. 8A, 8B, and 8C, the first mask patterns 320A are removed to expose the buffer mask layer 610 through spaces between adjacent two first spacers 350A.

Consequently, in the center portion 530C of the cell array region 530, the upper surface of the buffer mask layer 610 is exposed through the gaps between the first spacers 350A and the gaps between the first spacers 350A and the second spacers 350B. The exposed upper surface portions of the buffer mask layer 610 extend in a certain direction, that is, in direction y of FIG. 13A. The exposed upper surface portions of the buffer mask layer 610 alternately have two different lengths in direction y. A vertical distance dL2 between respective ends of every two adjacent exposed upper surface portions of the buffer mask layer 610 in direction y may be less than the vertical distance dL illustrated in FIGS. 8A, 8B, and 8C by the width SP4 of each of the fourth spacers 350D.

Referring to FIGS. 14A, 14B, and 14C, a plurality of isolation films 540' are formed in the substrate 600 by performing a series of processes as described above with reference to FIGS. 9A through 11C on the resultant structure illustrated in FIGS. 13A, 13B, and 13C.

The isolation film 540' of FIGS. 14A, 14B, and 14C are a plurality of line patterns extending parallel to each other in a certain direction, that is, in direction y of FIG. 14A. The isolation films 540' include first isolation films 542 having first ends 542E relatively far from the outline of the cell array region 530 in the edge portion 530E of the cell array region 530, and second isolation films 544' having second ends 544E' relatively close to the outline of the cell array region 530 compared with the first ends 542E of the first isolation films 542. In the cell array region 530, the first isolation films 542 and the second isolation films 544' alternate with each other one by one.

Each of the isolation films 540' of FIGS. 14A, 14B, and 14C has the same structure as each of the isolation films 540 of FIGS. 11A, 11B, and 11C except that each of the second isolation films 544' having the second ends 544E' has a length that is smaller than that of each of the second isolation films 544 of FIGS. 11A, 11B, and 11C by the width SP4 of each of the fourth spacers 350D. Accordingly, the first isolation film 542 and the second isolation film 544' have two different lengths in direction y which alternate with each other, and a vertical distance dL2 between the first end 542E of each of the first isolation films 542 and the second end 544E' of each of the second isolation films 544' in direction y may be less than the vertical distance dL illustrated in FIG. 11A by the width SP4 of each of the fourth spacers 350D.

Figure 15:
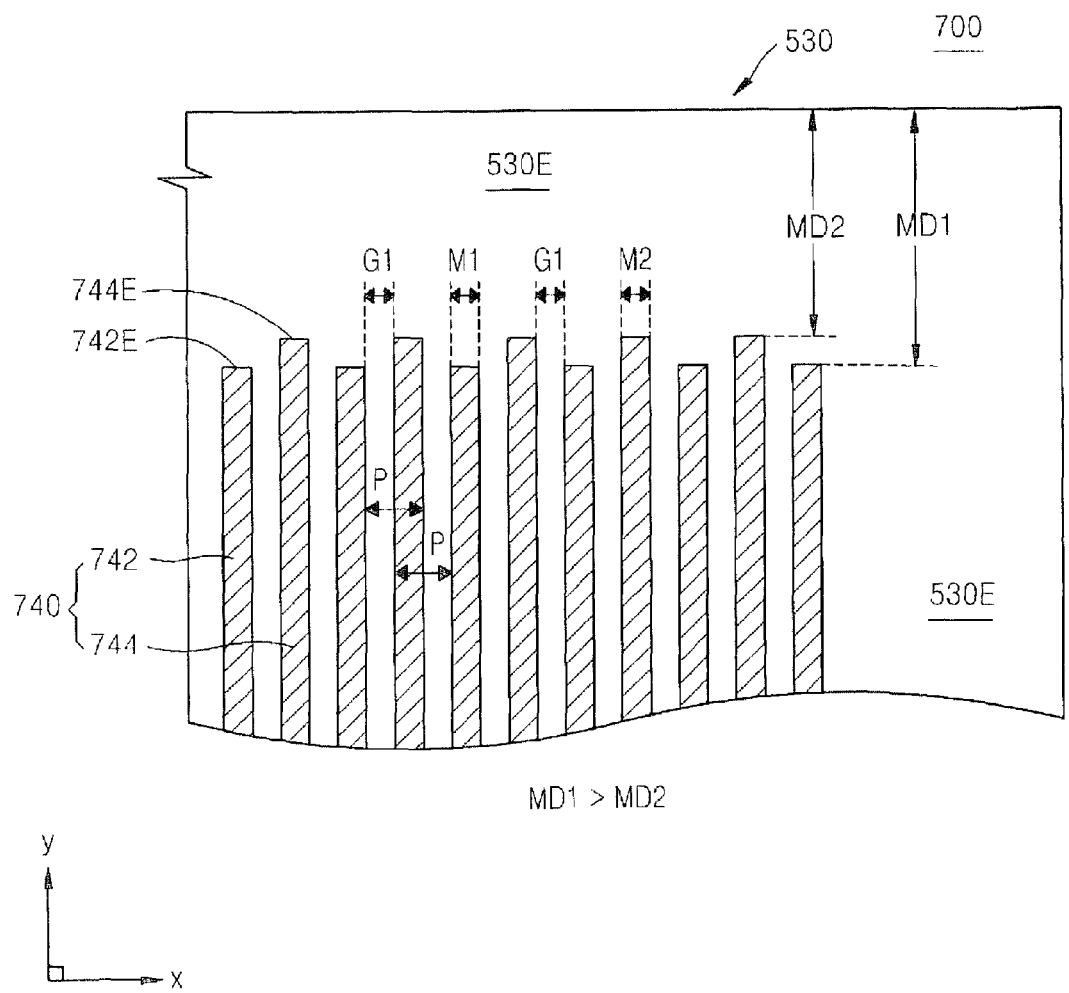
FIG. 15 is a layout of a structure of a part of a semiconductor device according to another embodiment of the present invention.

FIG. 15 is a layout of a structure of a part of a semiconductor device 700 according to another embodiment of the present invention.

FIG. 15 illustrates a layout of a plurality of conductive lines 740 formed in a part of a cell array region 530 in which the cell array 30 of the memory system 100 of FIG. 1 is formed. For example, the plurality of conductive lines 740 may be a plurality of bit lines that constitute the cell array 30.

In FIG. 15, the cell array region 530 includes an edge portion 530E corresponding to an edge of the cell array region 530, and a center portion 530C surrounded by the edge portion 530E.

A plurality of conductive lines 740 are formed in the center portion 530C of the cell array region 530.

The plurality of conductive lines 740 may be a plurality of line patterns extending parallel to each other in a certain direction, for example, in direction y of FIG. 15. The plurality of conductive lines 740 may each have a width M1. The plurality of conductive lines 740 may be apart from each other an interval G1. However, the present invention is not limited to what is illustrated in FIG. 15, and the width and interval of the conductive lines 740 may have various values according to desired layouts.

The plurality of conductive lines 740 includes a plurality of first conductive lines 742 having first ends 742E apart from the outline of the cell array region 530 by a relatively long distance MD1 in the edge portion 530E of the cell array region 530, and a plurality of second conductive lines 744 having second ends 744E apart from the outline of the cell array region 530 by a relatively short distance MD2 in the edge portion 530E of the cell array region 530. In the cell array region 530, the first conductive lines 742 and the second conductive lines 744 alternate with each other one by one and extend parallel to each other.

The plurality of conductive lines 740, which constitute the semiconductor device 700 illustrated in FIG. 15, may be formed according to a series of processes in which the first process illustrated in FIGS. 6A through 11C is used, or according to a series of processes in which the first process illustrated in FIGS. 12A through 14C is used. However, a conductive layer forming process for forming the plurality of conductive lines 740 of FIG. 15 on the substrate 600 needs to be performed.

The conductive layer forming process for forming the plurality of conductive lines 740 of FIG. 15 on the substrate 600 may be easily performed by one of ordinary skill in the art, with reference to the processes of FIGS. 6A through 11C or the processes of FIGS. 12A through 14C, and thus a detailed description thereof will be omitted.

Figure 16:
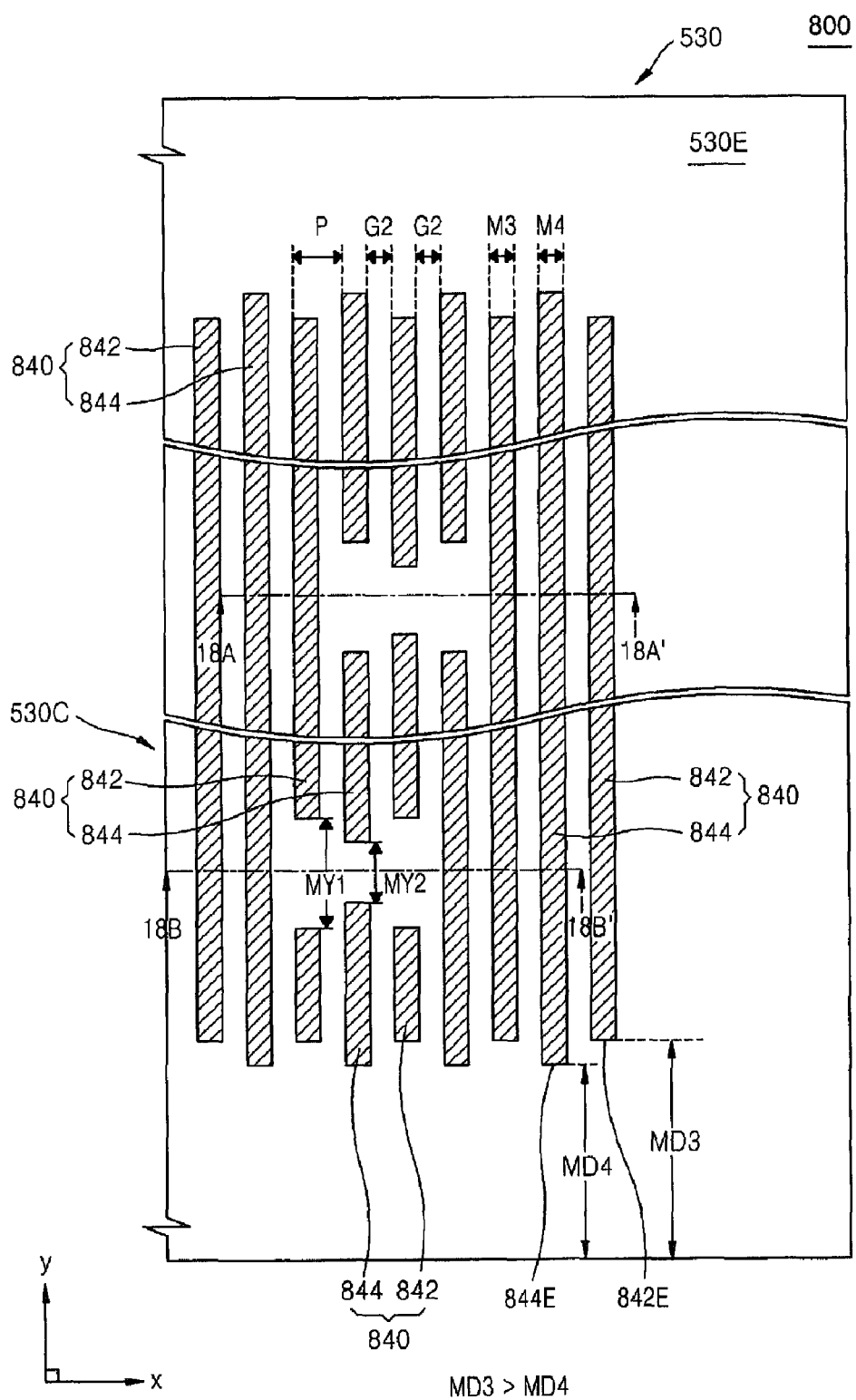
FIG. 16 is a layout of a structure of a part of a semiconductor device according to another embodiment of the present invention.

FIG. 16 is a layout of a structure of a part of a semiconductor device 800 according to another embodiment of the present invention.

FIG. 16 illustrates a layout of a metallization layer formed in a part of a cell array region 530 in which the cell array 30 of the memory system 100 of FIG. 1 is formed.

In FIG. 16, the cell array region 530 includes an edge portion 530E corresponding to an edge of the cell array region 530, and a center portion 530C surrounded by the edge portion 530E.

A plurality of metallization lines 840 are formed in each of the center portion 530C and the edge portion 530E of the cell array region 530. The plurality of metallization lines 840 may be a plurality of line patterns extending parallel to each other in a certain direction, for example, in direction y of FIG. 16. The plurality of metallization lines 840 may each have the same widths M3 or M4. However, the present invention is not limited to widths M3 or M4 illustrated in FIG. 16, and the width of the metallization lines 840 may have various values according to desired layouts.

The plurality of metallization lines 840 includes a plurality of first metallization lines 842 having first ends 842E apart from the outline of the cell array region 530 by a relatively long distance MD3 in the edge portion 530E of the cell array region 530, and a plurality of second metallization lines 844 having second ends 844E apart from the outline of the cell array region 530 by a relatively short distance MD4 in the edge portion 530E of the cell array region 530. In the cell array region 530, the first metallization lines 842 and the second metallization lines 844 alternate with each other one by one and extend parallel to each other.

The plurality of first metallization lines 842 may include two adjacent first metallization lines 842 which are arranged on a straight line in a certain direction, for example, in direction y of FIG. 16, and apart from each other by a distance MY1. The plurality of second metallization lines 844 may include two adjacent second metallization lines 844 which are arranged on a straight line in the certain direction, for example, in direction y of FIG. 16, and apart from each other by a distance MY2.

The plurality of metallization lines 840 may be arranged with widths M3 or M4 at intervals G2 in the center portion 530C of the cell array region 530 and repeated at fine pitches P.

Figure 17:
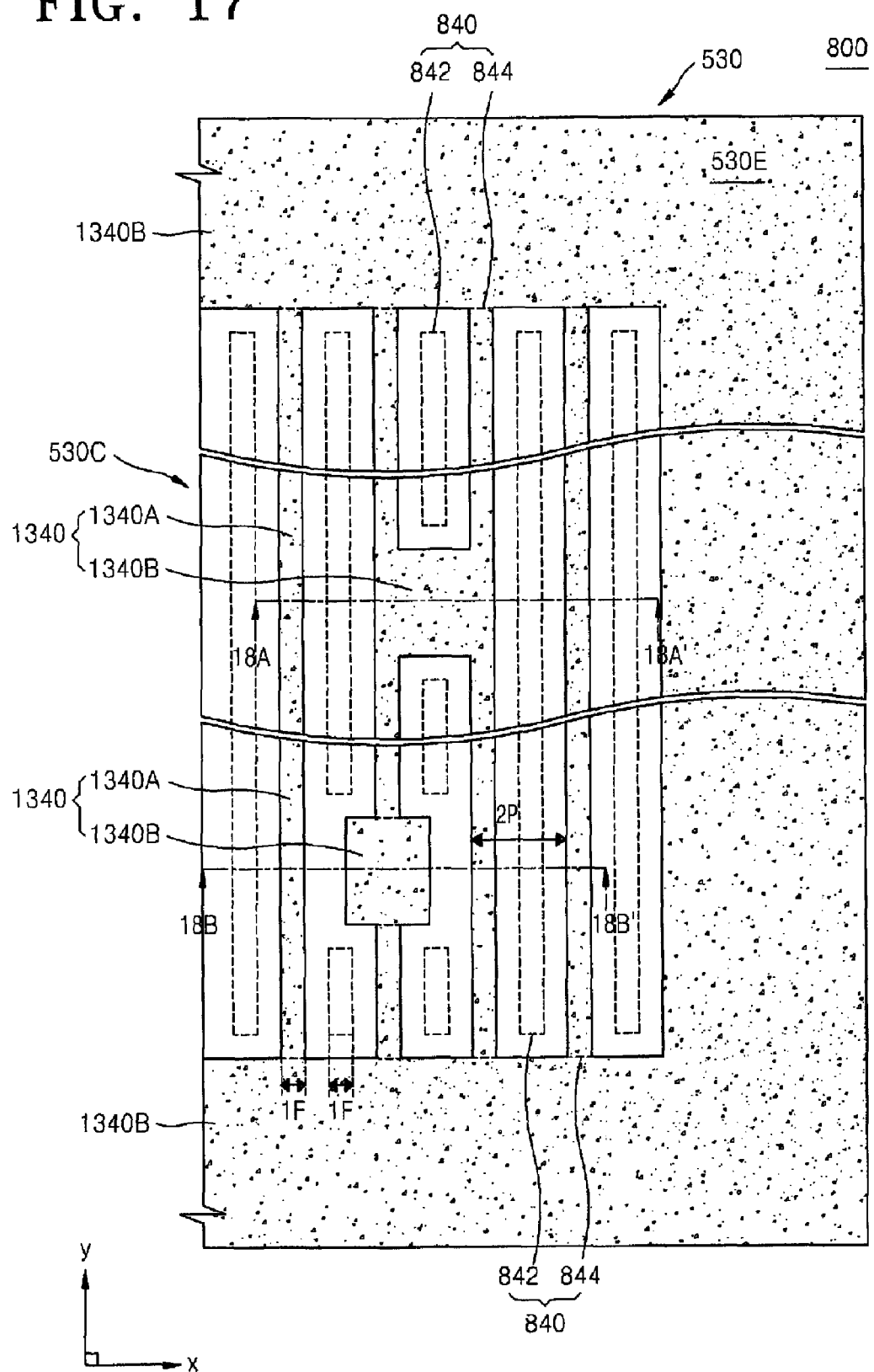
FIG. 17 is a plan view of a mask pattern that can be formed primarily according to a photolithographic process in order to form a plurality of metallization lines having the layout of FIG. 16 and a pattern density doubled by double patterning in a center portion of a cell array region by using methods according to the present invention.

FIG. 17 is a plan view of a mask pattern 1340 that can be primarily formed according to a photolithographic process in order to form the plurality of metallization lines 840 of FIG. 16, which has a pattern density doubled by double patterning, in the center portion 530C of the cell array region 530 by using a method according to the present invention.

In order to facilitate the understanding of the present invention, FIG. 17 illustrates the plurality of metallization lines 840 of FIG. 16 which are desired to be formed.

In the center portion 530C of the cell array region 530, the mask pattern 1340 including a plurality of first mask portions 1340A each having a width of 1F and being repeated at a pitch 2P, which is twice the fine pitch P, in a part of the center portion 530C of the cell array region 530 is formed to form the plurality of line pattern type metallization lines 840 each having the minimum feature size 1F of a memory cell. The mask pattern 1340 may also include a second mask portion 1340B which is located in a region where the metallization lines 840 are not formed cell array region 530, which has a relatively large width, and which is connected to the first mask portions 1340A, in another part of the center portion 530C of the cell array region 530.

The layout of the mask pattern 1340 illustrated in FIG. 17 may be equally applied to both the pattern forming method according to the present invention using the first process of FIGS. 3A through 3H and the pattern forming method according to the present invention using the second process of FIGS. 4A through 4D.

FIGS. 18A through 18G are cross-sections illustrating a method of manufacturing the semiconductor device 800 of FIG. 16.

FIGS. 18A through 18G illustrate a method of manufacturing the semiconductor device 800 by using the first process of FIGS. 3A through 3H, and the present invention is not limited thereto. In other words, the semiconductor device 800 may also be manufactured using the second process of FIGS. 4A through 4D.

A process of forming a plurality of damascene metallization lines arranged with uniform widths at regular intervals on a substrate 900 will be described in the manufacture of the semiconductor device 800 described later with reference to FIGS. 18A through 18G. The damascene metallization lines in FIGS. 18A through 18G may constitute a plurality of bit lines or a plurality of metal metallization layers in the semiconductor device 800. FIGS. 18A through 18G illustrate cross-sections taken along a plane 18A-18A' of FIG. 17 and cross-sections taken along a plane 18B-18B' of FIG. 17. Same reference numerals as those in FIGS. 3A through 3H denote same elements, and thus their description will be omitted.

Figure 18A:
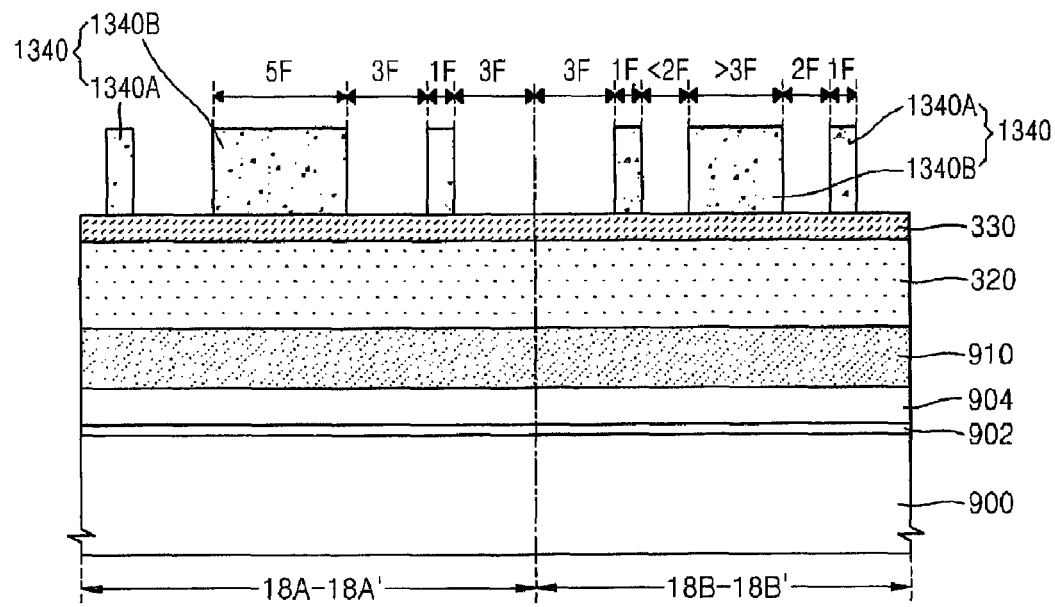
FIGS. 18A through 18G are cross-sections illustrating a method of manufacturing the semiconductor device of FIG. 16.

Referring to FIG. 18A, an etching stop layer 902 is formed on the substrate 900 on which unit elements, for example, a plurality of word lines, and an interlayer insulation film covering the unit elements have been formed. A mold layer 904 is formed on the etching stop layer 902. For example, the etching stop layer 902 may be a silicon nitride layer, and the mold layer 904 may be an oxide layer.

A buffer mask layer 910 is formed on the mold layer 904. The buffer mask layer 910 may have the same structure as the buffer mask layer 610 of FIGS. 6A through 6C. In a method as described above with reference to FIG. 3A, a dual mask layer 320 and an etching mask layer 330 are formed sequentially on the buffer mask layer 910. A mask pattern 1340 as illustrated in FIG. 17 is formed on the etching mask layer 330. The mask pattern 1340 may have the same construction as the mask pattern 340 of FIG. 3A except that they have different shapes as viewed from the top.

The mask pattern 1340 includes a plurality of first mask portions 1340A repeated at the pitch 2P, which is twice the fine pitch P, with a width of 1F in a part of the center portion 530C of the cell array region 530. The mask pattern 1340 also includes a second mask portion 1340B which has a relatively large width and is connected to the first mask portions 1340A, in another part of the center portion 530C of the cell array region 530. As illustrated in the cross-section taken along the plane 18A-18A', the center portion 530C of the cell array region 530 may include portions on which the first mask portions 1340A are apart from the second mask portions 1340B by an interval of 3F. As illustrated in the cross-section taken along the plane 18B-18B', the center portion 530C of the cell array region 530 may include portions on which the first mask portions 1340A are apart from the second mask portions 1340B by an interval less than 2F (that is, an interval of <2F). The second mask portion 1340B may have various widths according to embodiments. In FIG. 18A, the cross-section taken along the plane 18A-18A' illustrates a case where the second mask portion 1340B has a width of 5F, and the cross-section taken along the plane 18B-18B' illustrates a case where the second mask portion 1340B has a width greater than 3F (that is, a width of >3F).

Figure 18B:
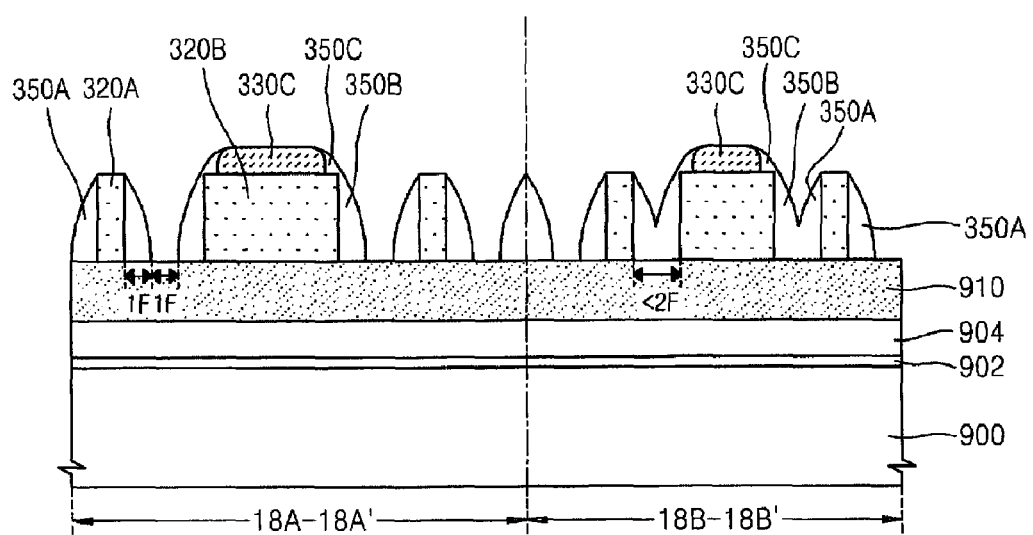

Referring to FIG. 18B, in a method as described above with reference to FIGS. 3B through 3F, a plurality of first, second, and third spacers 350A, 350B, and 350C are formed on the buffer mask layer 910. The plurality of first spacers 350A cover sidewalls of the first mask patterns 320A, and the plurality of second spacers 350B cover sidewalls of the second mask pattern 320B.

A portion having the width 1F of each of the first and second spacers 350A and 350B may cover the buffer mask layer 910.

After the first, second, and third spacers 350A, 350B, and 350C are formed, if the first and second spacers 350A and 350B each have a width of 1F, adjacent first and second spacers 350A and 350B may be apart from each other by an interval of 1F within a space corresponding to an interval 3F by which every adjacent first and second mask portions 1340A and 1340B are apart from each other, as illustrated in the cross-section taken along the plane 18A-18A'. The buffer mask layer 910 may be exposed through the intervals of 1F. However, as illustrated in the cross-section taken along the plane 18B-18B', within a space corresponding to an interval less than 3F by which every adjacent first and second mask portions 1340A and 1340B are apart from each other, adjacent first and second spacers 350A and 350B may be integrated into each other so that the buffer mask layer 910 is not exposed between the first and second spacers 350A and 350B.

Figure 18C:
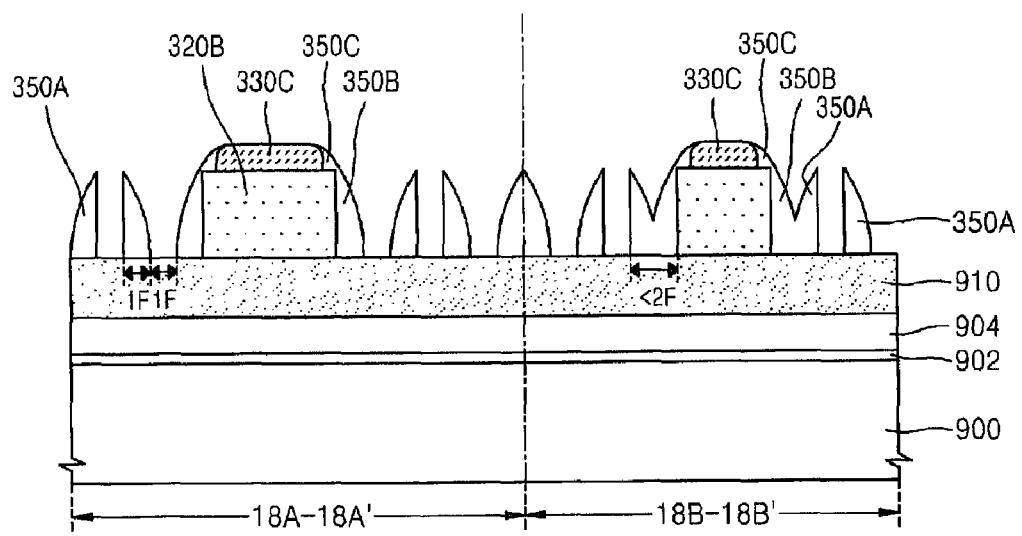

Referring to FIG. 18C, in a method as described above with reference to FIG. 3G, the plurality of first mask patterns 320A are removed to expose the buffer mask layer 910 through spaces between every two adjacent first spacers 350A.

Figure 18D:
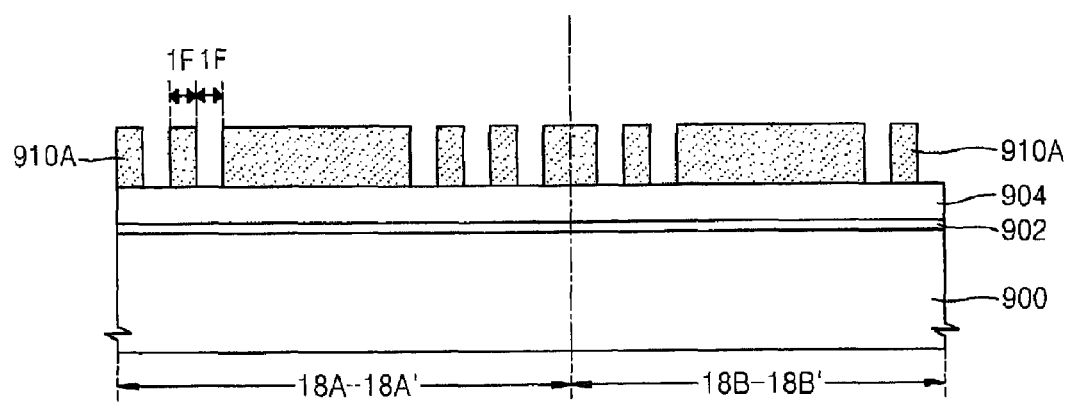

Referring to FIG. 18D, the buffer mask layer 910 is etched using the plurality of first spacers 350A, the second mask pattern 320B, and the plurality of second spacers 350B covering the sidewalls of the second mask pattern 320B as etch masks, thereby forming a buffer mask pattern 910A exposing the mold layer 904.

Figure 18E:
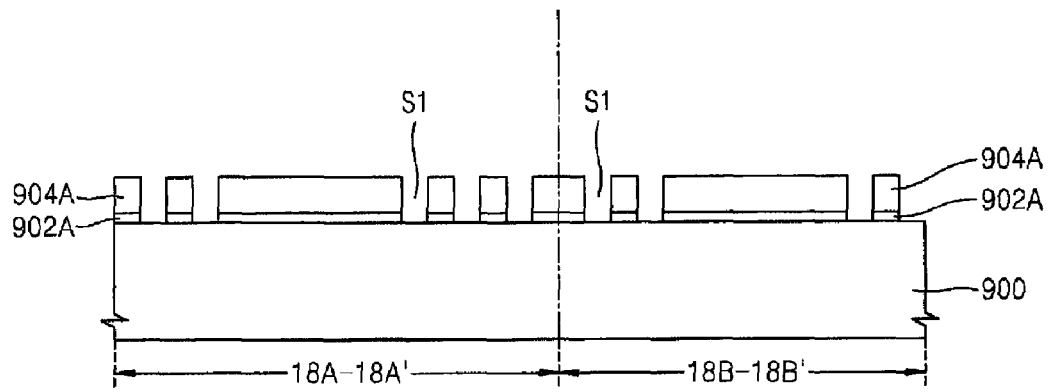

Referring to FIG. 18E, the mold layer 904 is etched using the buffer mask pattern 910A as an etch mask and the etching stop layer 902 as an etching stop point, thereby forming a plurality of mold patterns 904A and a plurality of etch stop layer patterns 902A. The upper surface of the substrate 900 is exposed through spaces S1 between the plurality of mold patterns 904A.

Although not shown in FIG. 18E, after the plurality of mold patterns 904A are formed, the plurality of buffer mask pattern 910A may remain as residual layers on the plurality of mold patterns 904A.

Figure 18F:
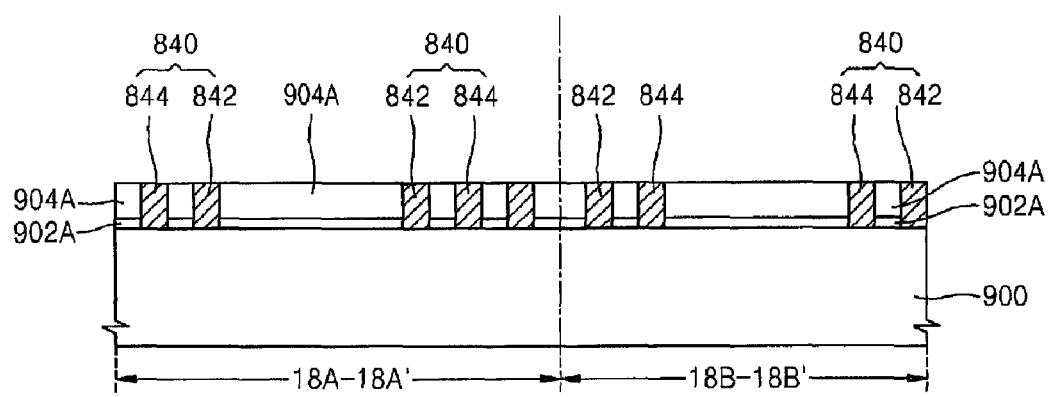

Referring to FIG. 18F, a conductive layer is formed by filling the spaces S1 between the plurality of mold patterns 904A according to a Damascene process, thereby forming a plurality of metallization lines 840 on the substrate 900.

A method of forming the plurality of metallization lines 840 according to the damascene process will now be described in greater detail. First, a barrier film (not shown) is formed on inside walls of the spaces S1 and the surfaces of the mold patterns 904A. Then, a metal film (not shown) with which the spaces S1 are to be completely filled is formed on the barrier film. The barrier film prevents metal atoms of the metal film from being spread to other films around the metal film. The formation of the barrier film is optional. The metal film may be formed of a metal selected from the group consisting of Cu, W, and Al, more preferably, formed of Cu because Cu has relatively small resistivity. The metal film may be formed by physical vapor deposition (PVD) or electroplating. Thereafter, a portion of the metal film and a portion of the barrier film are removed until the upper surfaces of the mold patterns 904A are exposed, thereby forming the plurality of metallization lines 840 including the barrier film and the metal film within the spaces S1 between the plurality of mold patterns 904A.

Figure 18G:
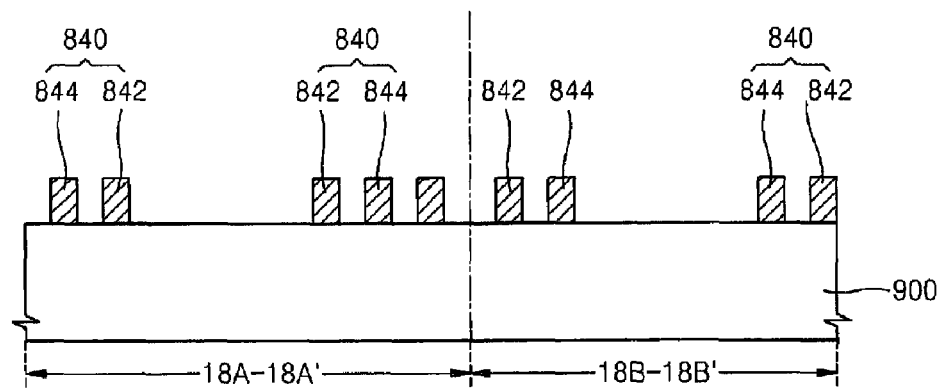

Referring to FIG. 18G, the plurality of mold patterns 904A and the plurality of etch stop layer patterns 902A are removed. In some cases, the process of FIG. 18G may be omitted.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising a plurality of line patterns extending parallel to each other in a first direction while being apart from each other in a center portion of a device region on a substrate, wherein the center portion is apart from a first side of the device region outside the center portion, wherein the plurality of line patterns comprises:
  a plurality of first line patterns alternatingly selected, in a second direction perpendicular to the first direction, from among the plurality of line patterns and each having a first end existing near the first side; and
  a plurality of second line patterns, alternatingly selected, in the second direction, from among the plurality of line patterns and each having a second end existing near the first side,
  wherein the first line patterns alternate with the second line patterns and the first end of each first line pattern is farther from the first side than the second end of each second line pattern.

2. The semiconductor device of claim 1, wherein the first and second line patterns are arrange in an alternating order extending in the second direction.

3. The semiconductor device of claim 1, wherein:
  each of the first ends of the first line patterns is a first distance away from the first side of the device region; and
  each of the second ends of the second line patterns is a second distance away from the first side of the device region, wherein the second distance is less than the first distance.

4. The semiconductor device of claim 1, wherein:
  the plurality of line patterns further comprises an outermost line pattern located adjacent to the outermost side of the plurality of line patterns; and
  the outermost line pattern has an end existing near the first side, wherein the end of the outermost line pattern is farther from the first side than an end existing near the first side from among two ends of a line pattern neighboring the outermost line pattern.

5. The semiconductor device of claim 1, wherein:
  the device region comprises a second side facing the first side with the center portion interposed between the first and second sides;
  the plurality of first line patterns have third ends corresponding to ends opposite to the first ends, wherein the third ends are farther from the second side than ends close to the second side from among respective both ends of every two second line patterns adjacent to both sides of each of the first line patterns; and the plurality of second line patterns have fourth ends corresponding to ends opposite to the second ends, wherein the fourth ends are closer to the second side than ends close to the second side from among respective both ends of every two first line patterns adjacent to both sides of each of the second line patterns.

6. The semiconductor device of claim 1, further comprising:
a plurality third line patterns a first distance apart from some first line patterns, respectively, selected from the plurality of first line patterns so as to be adjacent to the selected first line patterns, respectively, in the first direction in the center portion of the device region; and
a plurality fourth line patterns a second distance apart from some second line patterns, respectively, selected from the plurality of second line patterns so as to be adjacent to the selected second line patterns, respectively, in the first direction in the center portion of the device region.

7. The semiconductor device of claim 6, wherein the first distance is greater than the second distance.

8. The semiconductor device of claim 6, wherein the first distance and the second distance are greater than a width of each of the plurality of line patterns with respect to the second direction.

9. The semiconductor device of claim 6, wherein:
the center portion of the device region comprises non-pattern regions that extend along the first direction by lengths greater than the width in the second direction of each of the plurality of line patterns and in which the line patterns are not formed; and
widths in the first direction of the non-pattern regions are defined by each of the selected first line patterns and a corresponding one of the third line patterns and by each of the selected second line patterns and a corresponding one of the fourth line patterns, and widths in the second direction of the non-pattern regions are defined by two line patterns selected from the plurality of line patterns.

10. The semiconductor device of claim 9, wherein at least one line pattern selected from the third and fourth line patterns exist between the two line patterns selected from the plurality of line patterns.

11. The semiconductor device of claim 1, wherein the first line patterns and the second line patterns are arranged at regular intervals along the second direction.

12. The semiconductor device of claim 1, wherein the device region is a cell array region in which unit memories of the semiconductor device are formed.

13. The semiconductor device of claim 1, wherein the plurality of line patterns are isolation films for defining an active region in the device region.

14. The semiconductor device of claim 13, wherein a plurality of line-type active regions each located between every two of the plurality line patterns are defined by the plurality of line patterns in the center portion of the device region.

15. The semiconductor device of claim 13, further comprising:
a plurality of third line patterns a first distance apart from some first line patterns, respectively, selected from the plurality of first line patterns so as to be adjacent to the selected first line patterns, respectively, in the first direction in the center portion of the device region; and
a plurality of fourth line patterns a second distance apart from some second line patterns, respectively, selected from the plurality of second line patterns so as to be adjacent to the selected second line patterns, respectively, in the first direction in the center portion of the device region,
wherein island-type active regions are defined by the first, second, third, and fourth line patterns in the center portion of the device region.

16. The semiconductor device of claim 15, wherein the island-type active regions comprise portions having different widths in the first direction.

17. The semiconductor device of claim 16, wherein the island-type active regions comprise well forming regions for potential control.

18. The semiconductor device of claim 1, wherein each of the plurality of line patterns is formed of an insulation material.

19. The semiconductor device of claim 1, wherein each of the plurality of line patterns is formed of a conductive material.

* * * * *

UNITED STATES PATENT AND TRADEMARK OFFICE
CERTIFICATE OF CORRECTION

PATENT NO. : 8,368,182 B2
APPLICATION NO. : 12/573535
DATED : February 5, 2013
INVENTOR(S) : Lee et al.

Page 1 of 1

It is certified that error appears in the above-identified patent and that said Letters Patent is hereby corrected as shown below:

Title Page, Item (75) Inventor is corrected to read:
-- Young-ho Lee, Seoul (KR);
Jae-hwang Sim, Seoul (KR);
Young-seop Rah, Gyeonggi-do (KR);
Keon-Soo Kim, Suwon-si (KR) --.

Signed and Sealed this
Thirteenth Day of October, 2015

Michelle K. Lee
*Director of the United States Patent and Trademark Office*